(12) United States Patent
Nendai et al.

(10) Patent No.: US 9,111,892 B2
(45) Date of Patent: Aug. 18, 2015

(54) ORGANIC ELECTROLUMINESCENCE DISPLAY PANEL AND METHOD OF MANUFACTURING SAME

(71) Applicant: JOLED INC., Tokyo (JP)

(72) Inventors: Kenichi Nendai, Hyogo (JP); Takashi Osako, Kyoto (JP); Naoko Mizusaki, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/358,842

(22) PCT Filed: Nov. 20, 2012

(86) PCT No.: PCT/JP2012/007457
§ 371 (c)(1),
(2) Date: May 16, 2014

(87) PCT Pub. No.: WO2013/080490
PCT Pub. Date: Jun. 6, 2013

(65) Prior Publication Data
US 2014/0346484 A1   Nov. 27, 2014

(30) Foreign Application Priority Data

Dec. 2, 2011 (JP) ................................ 2011-265236

(51) Int. Cl.
| | |
|---|---|
| H01L 27/32 | (2006.01) |
| H01L 51/50 | (2006.01) |
| H01L 51/52 | (2006.01) |
| H01L 51/56 | (2006.01) |

(52) U.S. Cl.
CPC ........ *H01L 27/3279* (2013.01); *H01L 27/3258* (2013.01); *H01L 51/5228* (2013.01); *H01L 51/56* (2013.01); *H01L 27/3246* (2013.01); *H01L 2227/323* (2013.01)

(58) Field of Classification Search
None
See application file for complete search history.

(56) References Cited

U.S. PATENT DOCUMENTS 5,443,922 A   8/1995   Nishizaki et al.
7,839,083 B2 * 11/2010 Kubota ........................ 313/506
(Continued)

FOREIGN PATENT DOCUMENTS

| JP | 05-163488 | 6/1993 |
| JP | 2004-207217 | 7/2004 |
| JP | 2005-031645 | 2/2005 |

(Continued)

OTHER PUBLICATIONS

International Search Report (ISR) in International Patent Application No. PCT/JP2012/007457, dated Feb. 12, 2013.

*Primary Examiner* — Scott B Geyer
(74) *Attorney, Agent, or Firm* — Greenblum & Bernstein, P.L.C.

(57) ABSTRACT

A organic EL display panel includes an inter-layer insulation film, a pixel electrode, auxiliary wiring, a partition layer, an organic light-emitting layer, and a common electrode. The inter-layer insulation film has at least one paired concave portion and non-concave portion disposed in a region over the auxiliary wiring, a top face of the concave portion being concave with respect to a top face of the non-concave portion, and the auxiliary wiring includes a part over the concave portion and a part over the non-concave portion, a top face of the part over the concave portion being concave with respect to a top face of the part over the non-concave portion.

12 Claims, 24 Drawing Sheets

(56) References Cited

U.S. PATENT DOCUMENTS

| | | |
|---|---|---|
| 2004/0160170 A1 | 8/2004 | Sato et al. |
| 2005/0051776 A1 | 3/2005 | Miyagi et al. |
| 2005/0077816 A1* | 4/2005 | Yamada et al. ............... 313/503 |
| 2007/0190887 A1 | 8/2007 | Sato et al. |
| 2007/0257602 A1 | 11/2007 | Miyagi et al. |
| 2010/0252839 A1* | 10/2010 | Sagawa ......................... 257/88 |
| 2011/0210335 A1 | 9/2011 | Miyagi et al. |

FOREIGN PATENT DOCUMENTS

| | | |
|---|---|---|
| JP | 2009-163061 | 7/2009 |
| JP | 2009-199868 | 9/2009 |
| JP | 2009-259475 | 11/2009 |
| JP | 2011-107476 | 6/2011 |

* cited by examiner

ORGANIC ELECTROLUMINESCENCE DISPLAY PANEL AND METHOD OF MANUFACTURING SAME

TECHNICAL FIELD

The present invention pertains to an organic electroluminescence display panel (hereinafter, organic EL display panel) and to a manufacturing method for same, and particularly pertains to auxiliary wiring for diminishing a voltage drop toward the centre of the panel.

BACKGROUND ART

Presently, research and development are advancing in organic EL display panel of the active matrix type, where each pixel is provided with an organic electroluminescence element (hereinafter, organic EL element) along with a drive circuit to drive the organic EL element. The organic EL element includes a bottom electrode, a top electrode, and an organic light-emitting layer disposed between the electrodes, as well as a functional layer that includes a hole injection layer, a hole transport layer, an electron injection layer, an electron transport layer, and so on as needed. Typically, an organic EL display panel has a common electrode as the top electrode provided in common for all pixels, and a pixel electrode as the bottom electrode provided individually for each pixel. Also, top-emission configurations are often used to improve the pixel aperture ratio. In such cases, the common electrode acting as the top electrode is required to be optically transmissive. To ensure that the material is optically transmissive, using a transparent conductor such as indium tin oxide (hereinafter, ITO), indium zinc oxide (hereinafter, IZO), or zinc oxide. Alternatively, a 10 nm to 20 nm thin film of a metal such as silver, gold, or aluminium may be used. As it happens, transparent conductors such as ITO have high resistance relative to metal materials, which makes the common electrode prone to great drops in voltage toward the centre of the panel. Metal material such as silver has increased sheet resistance due to thinning, thus making the common electrode similarly prone to great drops in voltage toward the centre of the panel.

Conventionally, technology has been proposed for providing auxiliary wiring that reduces the voltage drop toward the centre of the panel (e.g., Patent Literature 1). FIG. 24 is a partial cross-sectional diagram showing the configuration of a organic EL display panel described in Patent Literature 1. Three pixels are shown.

The organic EL display panel includes a substrate 51, power supply wiring 52, a TFT layer 53, an inter-layer insulation film 54, a pixel electrode 55, auxiliary wiring 56, a partition layer 58, an organic light-emitting layer 60, and a common electrode 62. The pixel electrode 55 and the auxiliary wiring 56 are arranged at a distance from each other, on the inter-layer insulation film 54. The partition layer 58 is formed over the inter-layer insulation film 54, and has two types of openings, one type formed over the top of the pixel electrode 55 and the other type formed over the top of the auxiliary wiring 56. The organic light-emitting layer 60 is formed in each of the openings over the pixel electrode 55. Then, the common electrode 62 is formed so as to cover the partition layer 58, is electrically connected to the pixel electrode 55 via the organic light-emitting layer 60 through the openings over the pixel electrode 55, and electrically connected to the auxiliary wiring 56 through the openings over the auxiliary wiring 56. Although not illustrated, the auxiliary wiring 56 extends from a periphery of the panel to the centre of the panel. Providing the auxiliary wiring 56 in this way enables the combined resistance of the common electrode 62 and the auxiliary wiring 56 to be decreased in comparison to a configuration where the auxiliary wiring 56 is not provided, thereby diminishing the voltage drop toward the centre of the panel.

CITATION LIST

Patent Literature

[Patent Literature 1]
Japanese Patent Application Publication No. 2004-207217

SUMMARY OF INVENTION

Technical Problem

As it happens, other layers may form between the auxiliary wiring and the common electrode for reasons of convenience during the panel manufacturing process. For example, when a functional layer, including a hole injection layer, an electron transport layer, and so on, is formed over the pixel electrode, forming the functional layer locally may be difficult for cost or technical considerations. Thus, the functional layer may be formed over the auxiliary wiring, or a protection layer may be formed for protecting the auxiliary wiring surface from natural oxidation. In such cases, the contact resistance between the auxiliary wiring and the common electrode increases, which may cause the voltage drop toward the centre of the panel to be insufficiently reduced. Also, the decrease in contact resistance may be helpful even in cases where no other layers are present between the auxiliary wiring and the common electrode.

The present disclosure aims to provide technology for diminishing the voltage drop toward the centre of the panel by decreasing the contact resistance between the auxiliary wiring and the common electrode.

Solution to Problem

In one aspect, an organic electroluminescence display panel comprises: a substrate; a thin film transistor disposed over the substrate; an inter-layer insulation film disposed over the thin film transistor; a pixel electrode disposed over the inter-layer insulation film; auxiliary wiring disposed over the inter-layer insulation film with separation from the pixel electrode; a partition layer disposed over the inter-layer insulation film and having openings respectively arranged over the pixel electrode and over the auxiliary wiring; an organic light-emitting layer disposed in the openings over the pixel electrode; and a common electrode facing the pixel electrode through the openings over the pixel electrode and electrically connected to the pixel electrode via the organic light-emitting layer, and also facing the auxiliary wiring through the openings over the auxiliary wiring and electrically connected to the auxiliary wiring, wherein the inter-layer insulation film has at least one paired concave portion and non-concave portion disposed in an area over which the auxiliary wiring is disposed, a top face of the concave portion being concave with respect to a top face of the non-concave portion, and the auxiliary wiring includes a part over the concave portion and a part over the non-concave portion, a top face of the part over the concave portion being concave with respect to a top face of the part over the non-concave portion.

Advantageous Effects of Invention

According to this configuration, concave portions and non-concave portions are provided in the inter-layer insulation film, and the auxiliary wiring has corresponding concave portions and non-concave portions. Providing the auxiliary wiring on these concave portions and non-concave portions enables the surface area of electric contact between the common electrode and the auxiliary wiring to be increased. Accordingly, contact resistance between the common electrode and the auxiliary wiring is reduced, which in turn further diminishes a voltage drop toward the centre of the panel.

DESCRIPTION OF EMBODIMENTS

[Overview of Aspects]

Figure 1A:
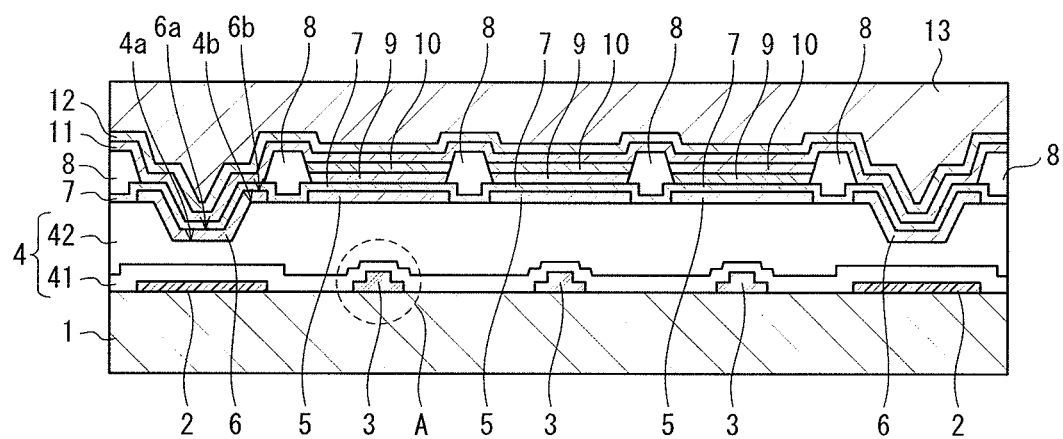
FIG. 1A is a cross-sectional diagram illustrating the configuration of an organic EL display panel pertaining to Embodiment 1 of the present disclosure.

In one aspect, an organic electroluminescence display panel comprises: a substrate; a thin film transistor disposed over the substrate; an inter-layer insulation film disposed over the thin film transistor; a pixel electrode disposed over the inter-layer insulation film; auxiliary wiring disposed over the inter-layer insulation film with separation from the pixel electrode; a partition layer disposed over the inter-layer insulation film and having openings respectively arranged over the pixel electrode and over the auxiliary wiring; an organic light-emitting layer disposed in the openings over the pixel electrode; and a common electrode facing the pixel electrode through the openings over the pixel electrode and electrically connected to the pixel electrode via the organic light-emitting layer, and also facing the auxiliary wiring through the openings over the auxiliary wiring and electrically connected to the auxiliary wiring, wherein the inter-layer insulation film has at least one paired concave portion and non-concave portion disposed in an area over which the auxiliary wiring is disposed, a top face of the concave portion being concave with respect to a top face of the non-concave portion, and the auxiliary wiring includes a part over the concave portion and a part over the non-concave portion, a top face of the part over the concave portion being concave with respect to a top face of the part over the non-concave portion.

According to this configuration, concave portions and non-concave portions are provided in the inter-layer insulation film, and the auxiliary wiring has corresponding concave portions and non-concave portions. Providing the auxiliary wiring on these concave portions and non-concave portions enables the surface area of electric contact between the common electrode and the auxiliary wiring to be increased. Accordingly, contact resistance between the common electrode and the auxiliary wiring is reduced, which in turn further reduces a drop in voltage at the centre of the panel.

Also, the inter-layer insulation film includes an insulating material that is exposed throughout the top face of the concave portion. That is, the concave portion of the inter-layer insulation film does not form a through-hole from the top face to the bottom face of the inter-layer insulation film. Accordingly, the auxiliary wiring is provided on the concave portions and the non-concave portions while electrical insulating properties are maintained in the auxiliary wiring.

Further, the inter-layer insulation film includes a passivation layer disposed over the thin film transistor and a planarization layer disposed over the passivation film, and the top face of the concave portion is located at one of a position within the planarization layer and a boundary between the passivation layer and the planarization layer. Accordingly, the auxiliary wiring is provided on the concave portions and the non-concave portions while electrical insulating properties are maintained in the auxiliary wiring.

In addition, a scan line is disposed over the substrate, for transmitting a scan signal controlling operations of the thin film transistor such that, as seen in a plan view, the area of the inter-layer insulation film over which the auxiliary wiring is disposed includes an overlapping region that overlaps the scan line and a non-overlapping region that does not overlap the scan line, and within the area, the concave portion of the inter-layer insulation film is disposed in the non-overlapping region and is not disposed in the overlapping region.

Given considerations of reducing delay in signals input to the scan lines, the parasitic capacitance of the scan line is beneficially reduced as much as possible. According to the above configuration, the concave portions of the inter-layer insulation film are not formed in regions overlapping the scan lines as seen in the plan view, thereby ensuring a certain degree of separation between the auxiliary wiring and the scan lines. Thus, the parasitic capacitance of the scan lines is reduced, which results in reduced delays for scan signal transmission by the scan lines.

Furthermore, the overlapping region of the inter-layer insulation film has a planar top face.

Additionally, as seen in the plan view, the scan line intersects the auxiliary wiring.

Alternatively, power supply wiring is further disposed over the substrate, for applying a power supply voltage to the thin film transistor, such that, as seen in a plan view, the concave portion of the inter-layer insulation film overlaps the power supply wiring, and the inter-layer insulation film includes an insulating material arranged between the power supply wiring and the auxiliary wiring part over the concave portion.

Also, a layer of material identical to the organic light-emitting layer disposed between the common electrode and the auxiliary wiring part over the concave portion.

In addition, the concave portion of the inter-layer insulation film includes a first groove extending along the auxiliary wiring and a second groove that intersects at least part of the first groove, and the second groove is wider than the first groove.

As an alternative, the concave portion of the inter-layer insulation film includes a first groove extending along the auxiliary wiring and a second groove that intersects at least part of the first groove, and the second groove is deeper than the first groove.

As a further alternative, a functional layer is in contact with the organic light-emitting layer through the openings over the pixel electrode, and with the auxiliary wiring through the openings over the auxiliary wiring, and the common electrode is in contact with the functional layer through the openings over the auxiliary wiring.

In another aspect, a manufacturing method for an organic electroluminescence display panel comprises: preparing a substrate; forming a thin film transistor over the substrate; forming an inter-layer insulation film over the thin film transistor; a pixel electrode disposed over the inter-layer insulation film; forming auxiliary wiring over the inter-layer insulation film with separation from the pixel electrode; forming a partition layer over the inter-layer insulation film with openings respectively formed over the pixel electrode and over the auxiliary wiring; forming an organic light-emitting layer in the openings over the pixel electrode; and forming a common electrode facing the pixel electrode through the openings over the pixel electrode and electrically connected to the pixel electrode via the organic light-emitting layer, and also facing the auxiliary wiring through the openings over the auxiliary wiring and electrically connected to the auxiliary wiring, wherein the inter-layer insulation film is formed to have at least one paired concave portion and non-concave portion formed in an area over which the auxiliary wiring is disposed, a top face of the concave portion being concave with respect to a top face of the non-concave portion, and the auxiliary wiring is formed to include a part over the concave portion and a part over the non-concave portion, a top face of the part over the concave portion being concave with respect to a top face of the part over the non-concave portion.

Embodiments of the disclosure are described below, with reference to the accompanying drawings.

Embodiment 1

<Overall Configuration>

Figure 1B:
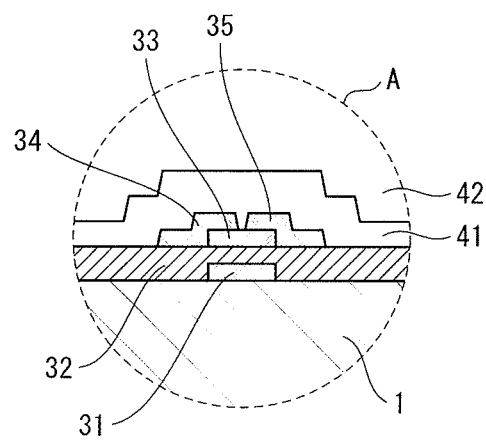
FIG. 1B is a partial magnified view.

FIG. 1A is a cross-sectional diagram illustrating the configuration of an organic EL display panel pertaining to Embodiment 1 of the present disclosure, and FIG. 1B is a partial magnified view. Three pixels are shown.

The organic EL display panel includes a substrate 1, power supply wiring 2, thin-film transistors (hereinafter, TFTs) 3, an inter-layer insulation film 4, pixel electrodes 5, auxiliary wiring 6, a hole injection layer 7, a partition layer 8, a hole transport layer 9, an organic light-emitting layer 10, an electron transport layer 11, a common electrode 12, and a sealing layer 13.

The substrate 1 is made of an insulating material, such as glass or resin.

The power supply wiring 2 is arranged over the substrate 1. The material for the power supply wiring 2 may be any known wiring material having conductivity.

The TFTs 3 are arranged over the substrate 1. As shown in the magnified view of portion A, each of the TFTs 3 includes a gate electrode 31, a gate insulation film 32, a semiconductor layer 33, a drain electrode 34, and a source electrode 35. The TFTs 3 are not limited to this configuration, and may be configured differently.

The inter-layer insulation film 4 is arranged over the TFTs 3. Although not illustrated, the inter-layer insulation film 4 has contact holes arranged at every pixel, for electrically connecting each of the pixel electrodes 5 to a corresponding one of TFTs 3. In the present disclosure, the inter-layer insulation film 4 includes a passivation film 41 and a planarization film 42. The passivation film 41 covers the power supply wiring 2 and the TFTs 3, thereby providing protection to the power supply wiring 2 and the TFTs 3. The planarization film 42 is arranged over the passivation film and is provided in order to flatten the foundation of the pixel electrodes 5. The material for the passivation film 41 and the planarization film 42 may be any known inorganic or organic material having insulating properties. In the present Embodiment, a photosensitive resin is used as the material for the planarization film 42.

The pixel electrodes 5 are arranged over the inter-layer insulation film 4. The pixel electrodes 5 are provided separately, one for each pixel. The material for the pixel electrodes 5 may be any material having conductivity and, for a top-emission panel, also reflectivity. Such materials include aluminium, aluminium alloy, silver, silver alloy, and so on.

The auxiliary wiring 6 is arranged over the inter-layer insulation film 4 with separation from the pixel electrodes 5. The material for the auxiliary wiring 6 may be any material having conductivity. When the auxiliary wiring 6 and is formed in the same process as the pixel electrodes 5, the same material as the pixel electrodes 5 is necessarily used.

The hole injection layer 7 injects holes supplied by the pixel electrodes 5 to the organic light-emitting layer 10. The material for the hole injection layer 7 is, for example, a transition metal oxide such as tungsten oxide or molybdenum oxide. Also, the hole injection layer 7 need only be above the pixel electrodes 5 and need not necessarily be provided over the auxiliary wiring 6. However, in the present Embodiment, the hole injection layer 7 covers the top of the inter-layer insulation film 4 in entirety, for purposes of manufacturing process simplification. As a result, the hole injection layer 7 is present over the auxiliary wiring 6.

The partition layer 8 is arranged over the inter-layer insulation film 4, and has two types of openings, one type formed over the top of the pixel electrodes 5 and the other type formed over the top of the auxiliary wiring 6. The material for the partition layer 8 may be any known inorganic or organic material having insulating properties. In the present Embodiment, a photosensitive resin is used as the material for the partition layer 8.

The hole transport layer 9 is formed in each of the openings of the partition layer 8 over the pixel electrodes. The materials for the hole transport layer 9 are known. For example, as listed in Japanese Patent Application No. H5-163488, a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative may be used. Using a porphyrin compound or an aromatic tertiary amine compound and styrylamine compound is particularly beneficial.

The organic light-emitting layer 10 is formed over the hole transport layer 9 in each of the openings of the partition layer 8 over the pixel electrodes. The organic light-emitting layer 10 emits light in three colours, R, G, and B, through recombination of holes and electrons. The materials for the organic light-emitting layer 10 are known. For example, materials cited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on may be used.

The electron transport layer 11 is arranged in the type of opening over the pixel electrodes to face the pixel electrodes 5, and in the type of opening over the auxiliary wiring to face the auxiliary wiring 6. The electron transport layer 11 transports electrons supplied by the common electrode 12 to the organic light-emitting layer 10. The materials for the electron transport layer 11 are known. For example, one of the materials listed in Japanese Patent Application Publication No. H5-163488, such as a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, may be used. Also, for electron injection improvement considerations, the above materials may also be doped with an alkali metal or with an alkali earth metal such as sodium, barium, or calcium. The electron transport layer 11 need not necessarily be present in the type of opening over the auxiliary wiring, provided that it is present in the type of opening over the pixel electrodes. However, in the present Embodiment, the electron transport layer 11 covers the top of the partition layer 8 in entirety, for purposes of manufacturing process simplification. As a result, the electron transport layer 11 is over the auxiliary wiring 6.

The common electrode 12 faces the pixel electrodes 5 through the type of opening over the pixel electrodes, is electrically connected to the pixel electrodes 5 via the electron transport layer 11, the organic light-emitting layer 10, the hole transport layer 9, and the hole injection layer 7, faces the auxiliary wiring 6 through the type of opening over the auxiliary wiring, and is electrically connected to the auxiliary wiring 6 via the electron transport layer 11 and the hole injection layer 7. Specifically, the common electrode 12 includes a first part arranged in the type of opening over the pixel electrodes, a second part arranged in the type of opening over the auxiliary wiring, and a third part arranged over the partition layer 8. The first part, the second part, and the third part are continuous. The material for the common electrode 12 may be any material having conductivity and, for a top-emission panel, is also optically transmissive. To ensure that the material is optically transmissive, using a transparent conductor such as ITO, IZO, or zinc oxide. Alternatively, a 10 nm to 20 nm thin film of a metal such as silver, gold, or aluminium may be used.

The sealing layer 13 protects the organic light-emitting layer 10 from intrusion by water and oxygen. The material for the sealing layer 13 may be a known material such as silicon nitride, silicon oxide, silicon oxynitride, or aluminium oxide.

Figure 2:
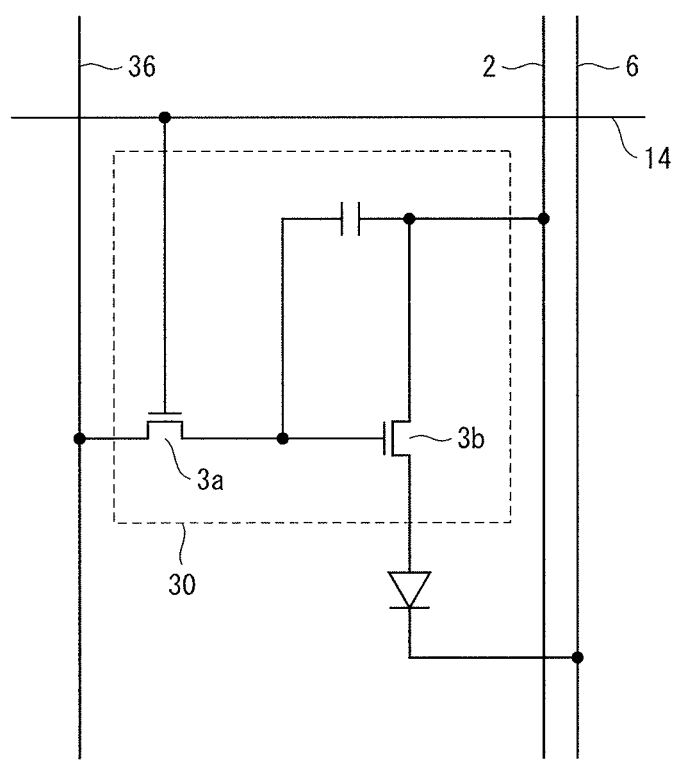
FIG. 2 illustrates a pixel circuit.

In the present Embodiment, the organic EL element includes the pixel electrodes 5, the hole injection layer 7, the hole transport layer 9, the organic light-emitting layer 10, the electron transport layer 11, and the common electrode 12. Also, one organic EL element and one pixel circuit are provided for each pixel. FIG. 2 illustrates a pixel circuit.

A pixel circuit 30 includes p-type TFTs 3a and 3b, and a capacitor. A source electrode of TFT 3a is connected to a data line 36, a drain electrode of TFT 3a is connected to a gate electrode of TFT 3b, and a gate electrode of TFT 3a is connected to a scan line 14. Also, a source electrode of TFT 3b is connected to the power supply wiring 2, a drain electrode of TFT 3b is connected to an anode (i.e., pixel electrode) of the organic EL element, and the gate electrode of TFT 3b is connected to the drain electrode of TFT 3a. The capacitor is connected between the source and gate electrodes of TFT 3b. Also, a cathode (i.e., common electrode) of the organic EL element is connected to the auxiliary wiring 6. The power supply wiring 2 is intended to apply a power source voltage to the source electrode of TFT 3*b*. The auxiliary wiring 6 is intended to apply a ground voltage to the cathode of the organic EL element. The scan line 14 is intended to deliver a scan signal that controls operations of TFT 3*a*. The data line 36 is intended to deliver a data signal that controls operations of TFT 3*b*.

The power supply wiring 2, the auxiliary wiring 6, and the data line 36 each extend in a column direction of the organic EL display panel. Also, the scan line 14 extends in a row direction of the organic EL display panel. Further, the power supply wiring 2 extends to a panel periphery and is electrically connected to a power terminal of an external power supply located at the panel periphery. The auxiliary wiring 6 extends to panel the periphery is electrically connected to a ground terminal of the external power supply, located at the panel periphery. In addition, the data line 36 and the scan line 14 extend to the panel periphery and are electrically connected to an external drive circuit, located at the panel periphery.

<Auxiliary Wiring Details>

The shape of the auxiliary wiring is particular to the present Embodiment. The shape of the auxiliary wiring is described in detail below.

Figure 3:
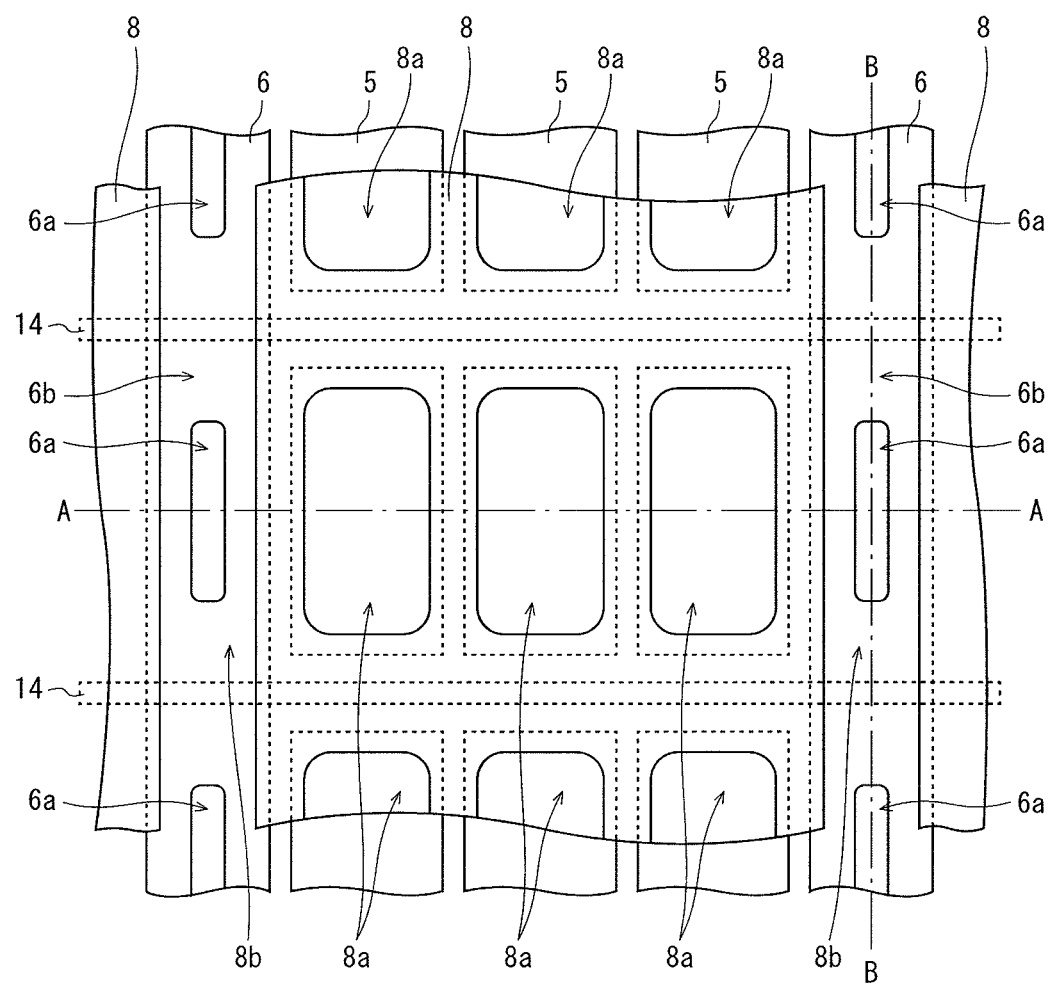
FIG. 3 is plan view diagram showing the layout of the organic EL display panel of FIG. 1, including a pixel electrode, auxiliary wiring, a partition layer, and scan lines.

FIG. 3 shows a plan view of the layout including pixel electrodes, auxiliary wiring, the partition layer, and scan lines. Line A-A corresponds to the cross-section shown in FIG. 1. Each pixel electrode 5 is substantially rectangular. As shown in FIG. 5, several pixel electrodes 5 are arranged in a matrix and are separated from each other. The auxiliary wiring 6 is disposed in stripes that extend in the column direction. The partition layer 8 has openings 8*a* of the first type, each formed over one of the pixel electrodes 5, and openings 8*b* of the second type, each formed over the auxiliary wiring 6. The scan lines 14 extend in the row direction. That is, the auxiliary wiring 6 and the scan line 14 intersect, as seen in the plan view.

Figure 4:
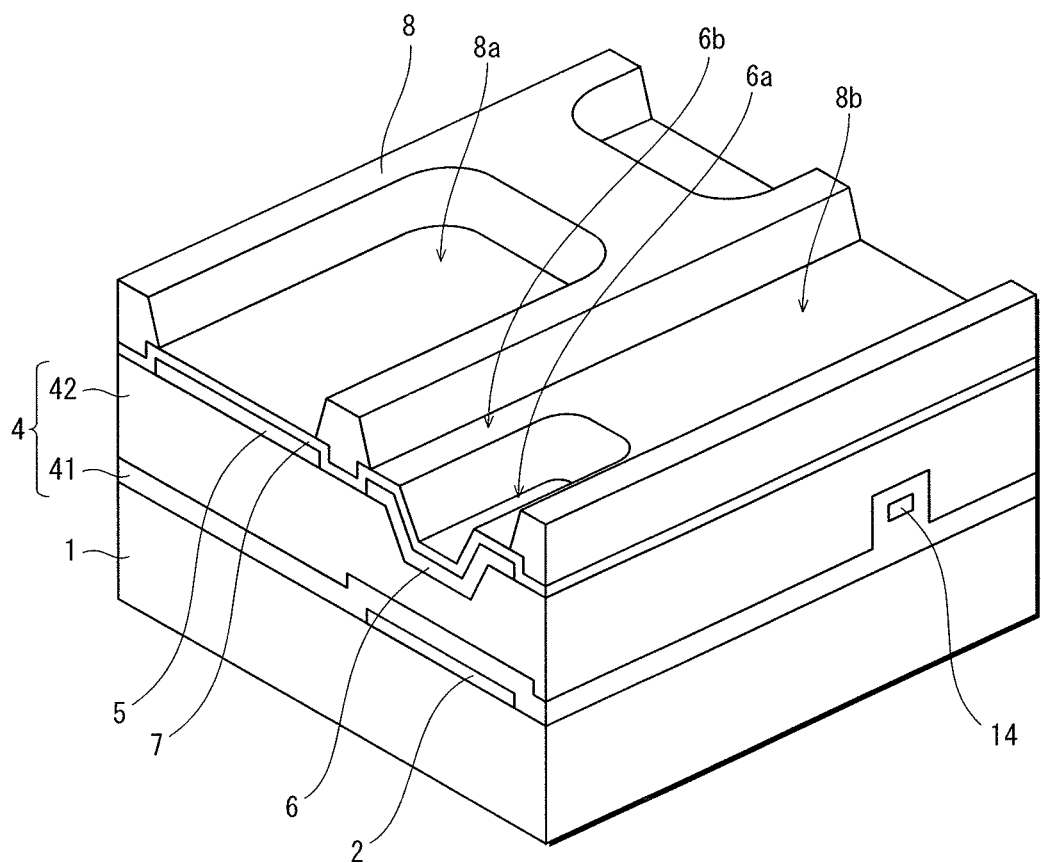
FIG. 4 is a partial perspective view diagram of the organic EL display panel of FIG. 1.

The auxiliary wiring 6 includes concave portions 6*a*, which are groove shaped, and non-concave portions 6*b*. Each concave portion 6*a* has a longitudinal length that is shorter than a column-wise length of one pixel. The concave portions 6*a* are provided in a quantity corresponding to the number of rows. The arrangement of the concave portions 6*a* and the non-concave portions 6*b* of the auxiliary wiring 6 is easily understood with reference to FIG. 4, which is a partial perspective view diagram of the organic EL display panel. The concave portions 6*a* are concave with respect to the non-concave portions 6*b*.

Figure 5A:
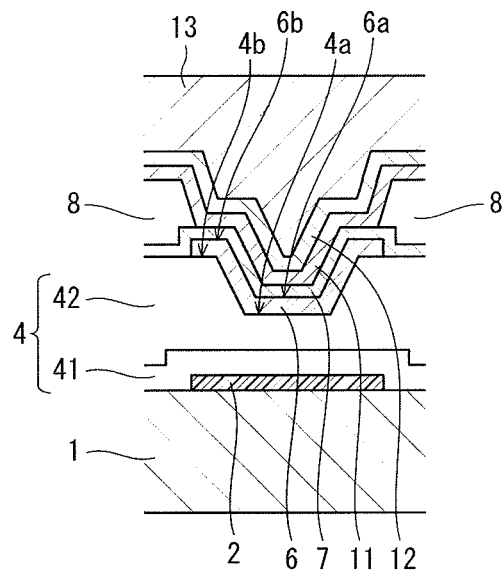
FIG. 5A is a cross-section taken along line A-A of FIG. 3.
Figure 5B:
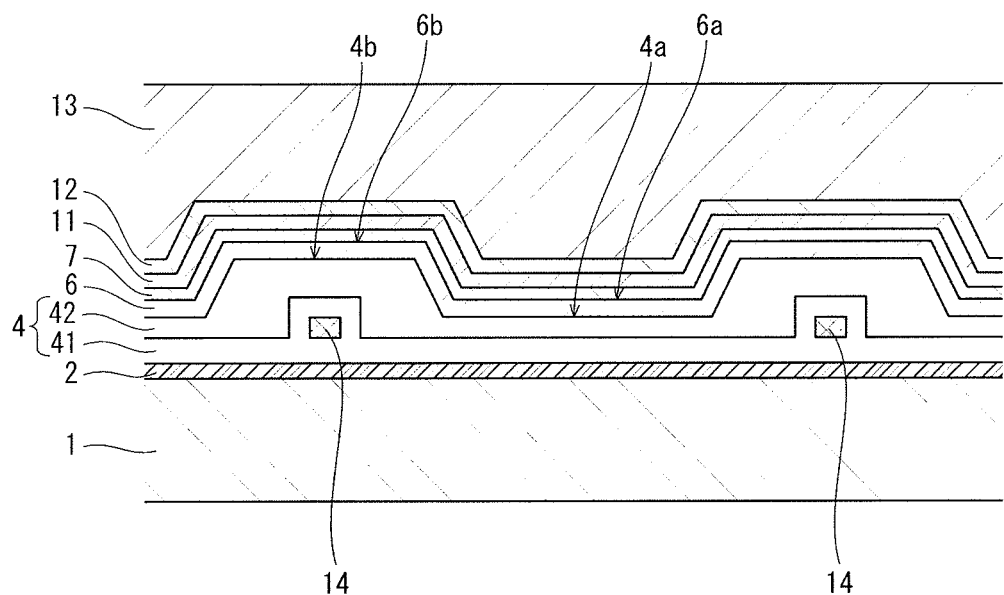
FIG. 5B is a cross-section taken along line B-B of FIG. 3.

FIG. 5A is a cross-section taken along line A-A of FIG. 3, and FIG. 5B is a cross-section taken along line B-B of FIG. 3. The inter-layer insulation film 4 includes concave portions 4*a* and non-concave portions 4*b*, and the auxiliary wiring 6 has the concave portions 6*a* and non-concave portion 6*b* formed accordingly. The hole injection layer 7, the electron transport layer 11, and the common electrode 12 are formed concavely, in accordance with the shape of the concave portions 6*a* of the auxiliary wiring concave portion. Normally, the thickness of the inter-layer insulation film 4 is on the order of a few microns. Therefore, the depth of the concave portions 4*a* relative to the non-concave portions 4*b* is also on the order of a few microns. In contrast, the thickness of the auxiliary wiring 6 is on the order of a few hundred manometers. Thus, the shape of the concave portions 4*a* of the inter-layer insulation film 4 reflects the shape of the concave portions 6*a* of the auxiliary wiring 6. Also, the respective thicknesses of the hole injection layer 7 and the electron transport layer 11 are on the order of a few tens of manometers, and can thus be ignored due to being extremely thin. As such, the common electrode 12 also has concavities conforming to the concave portions 6*a* of the auxiliary wiring 6. These enable expansion of the region in which the common electrode 12 is in electrical contact with the auxiliary wiring 6 (i.e., the contact surface area). The amount of expansion in this electrical contact surface area roughly corresponds to the surface area of side walls formed at the boundary between the concave portions 6*a* and the non-concave portions 6*b* of the auxiliary wiring 6. According to the above, contact resistance between the common electrode 12 and the auxiliary wiring 6 is reduced, which in turn further reduces a drop in voltage at the centre of the panel.

The depth of the concave portions 4*a* of the inter-layer insulation film 4 is established so as to avoid passing completely through the planarization film 42. Therefore, the insulating material making up the planarization film 42 is exposed across the entire top face of the concave portion 4*a* of the inter-layer insulation film 4. That is, the concave portion 4*a* of the inter-layer insulation film 4 does not form a through-hole from the top face to the bottom face of the inter-layer insulation film 4. Accordingly, the auxiliary wiring 6 and the power supply wiring 2 each extend in the column direction and occupy corresponding positions as seen in the plan view, but electrical insulating properties are maintained between the two components.

Also, as shown in FIG. 3, the concave portions 6*a* of the auxiliary wiring 6 are not formed in regions overlapping the scan lines 14 as seen in the plan view, and are instead formed only in regions that do not overlap the scan lines 14. That is, regions where the auxiliary wiring 6 and the scan lines 14 overlap in the plan view are flat. Accordingly, as shown in FIG. 5B, a certain separation is maintained between the auxiliary wiring 6 and the scan line 14. Thus, the parasitic capacitance of the scan lines 14 is reduced, which results in reduced delays for scan signal transmission by the scan lines 14.

<Manufacturing Method>

FIGS. 6A-6D, 7A-7D, and 8A-8D are cross-sectional diagrams illustrating a manufacturing process for the organic EL display panel.

First, the power supply wiring 2 and the TFTs 3 are formed over the substrate 1. The passivation film 41 is further formed over the substrate 1, so as to cover the power supply wiring 2 and the TFTs 3 (see FIG. 6A).

Figure 6A:
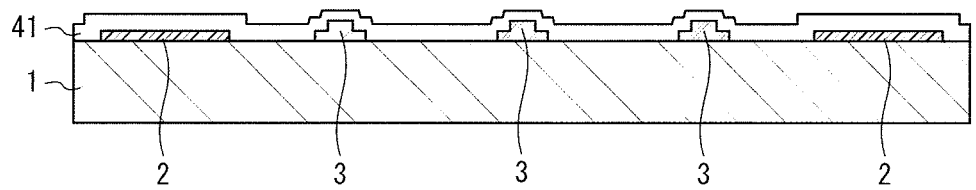
FIGS. 6A-6D are cross-sectional diagrams illustrating a manufacturing process for the organic EL display panel of FIG. 1.
Figure 6B:
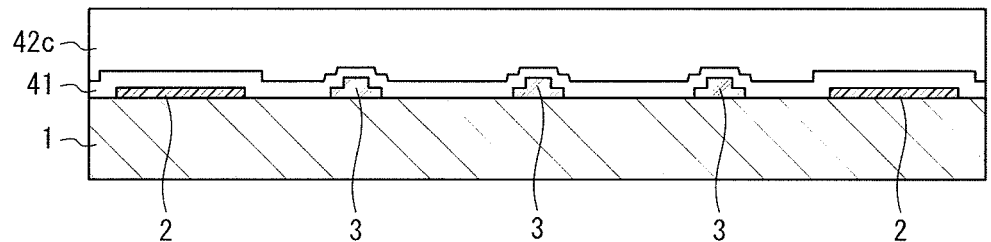

Next, a planarization material layer 42*c* is layered in order to form the planarization film 42 (see FIG. 6B).

Figure 6C:
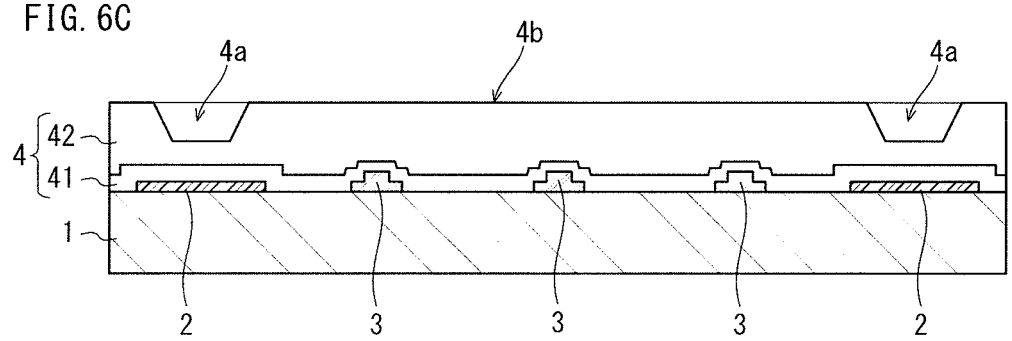

Afterwards, the planarization material layer 42*c* is exposed through a photo-mask. The planarization film 42 is then formed with the concave portions 4*a* and the non-concave portions 4*b* through a developing process (FIG. 6C). A process of forming contact holes in the planarization film 42 for electrically connecting to one of the pixel electrodes 5 and the TFTs 3 may be performed at the same occasion. Here, the depth of the concave portions 4*a* relative to the non-concave portions 4*b* is adjustable by changing the optical transmittance of the photo-mask. For example, when the planarization material layer 42*c* is made of material remaining in a non-exposed region after the developing process has been applied to the exposed regions, exposure is applied to a region of the planarization material layer 42*c* at locations where the concave portions 4*a* are to be formed. Here, a half-tone mask is usable for adjusting the amount of light in the regions where the concave portions 4*a* are to be formed. The depth of the concave portion 4*a* is thus adjustable.

Figure 6D:
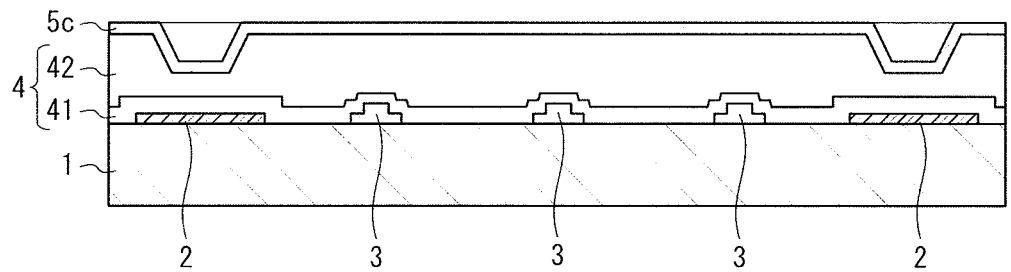

Next, a conductive layer 5*c* for forming the pixel electrodes 5 and the auxiliary wiring 6 is layered over the planarization film 42 (see FIG. 6D). The pixel electrodes 5 and the auxiliary wiring 6 are then formed by etching the conductive layer 5*c*

Figure 7A:
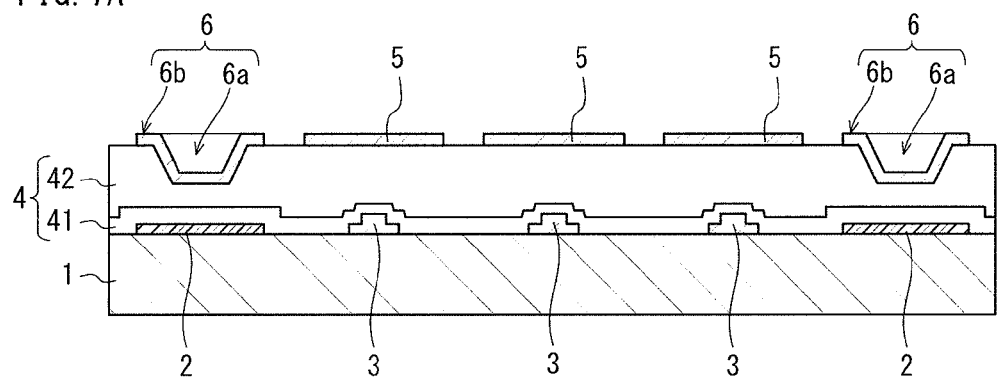
FIGS. 7A-7D are cross-sectional diagrams illustrating the manufacturing process for the organic EL display panel of FIG. 1.

(see FIG. 7A). The thickness of the auxiliary wiring 6 is less than the depth of the concave portions 4a of the inter-layer insulation film 4. Thus, the shape of the concave portions 4a of the inter-layer insulation film 4 reflects the shape of the concave portions 6a of the auxiliary wiring 6.

Figure 7B:
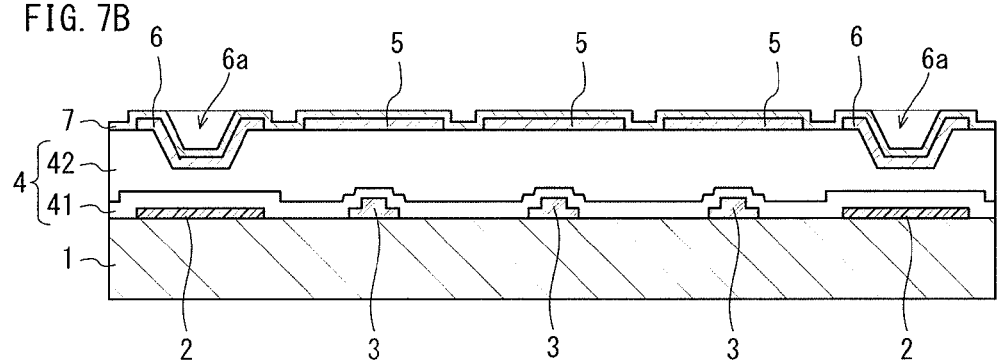
Figure 7C:
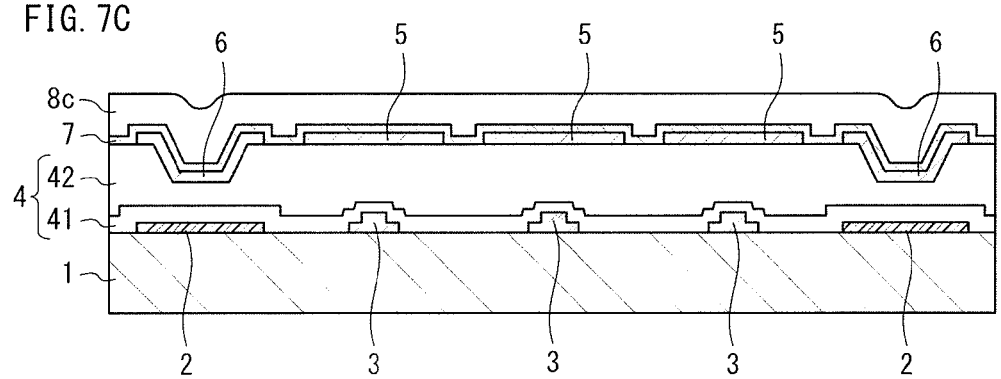
Figure 7D:
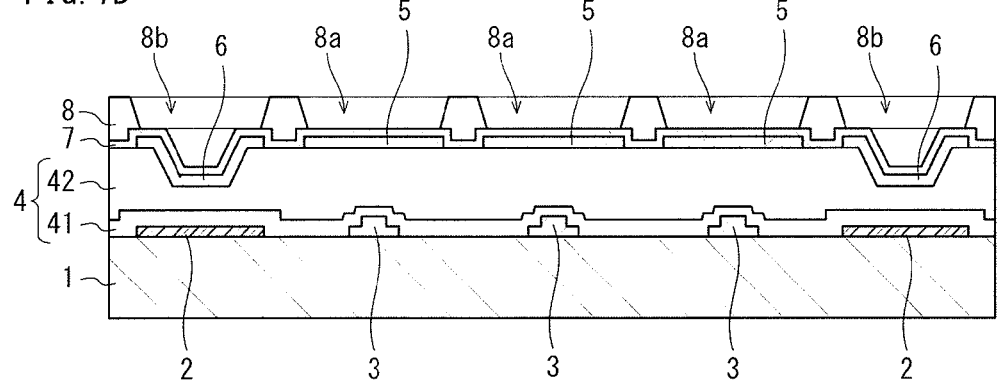

Subsequently, the hole injection layer 7 is layered over the inter-layer insulation film 4 having the pixel electrodes 5 and the auxiliary wiring 6 formed thereon (see FIG. 7B). A partition material layer 8C for forming the partition layer 8 is then layered over the hole injection layer 7 (see FIG. 7C).

Next, the partition material layer 8c is exposed through a photo-mask. Afterward, a developing process is performed to form the partition layer 8 having the openings 8a formed above the pixel electrodes 5 and the openings 8b formed over the auxiliary wiring 6 (see FIG. 7D).

Figure 8A:
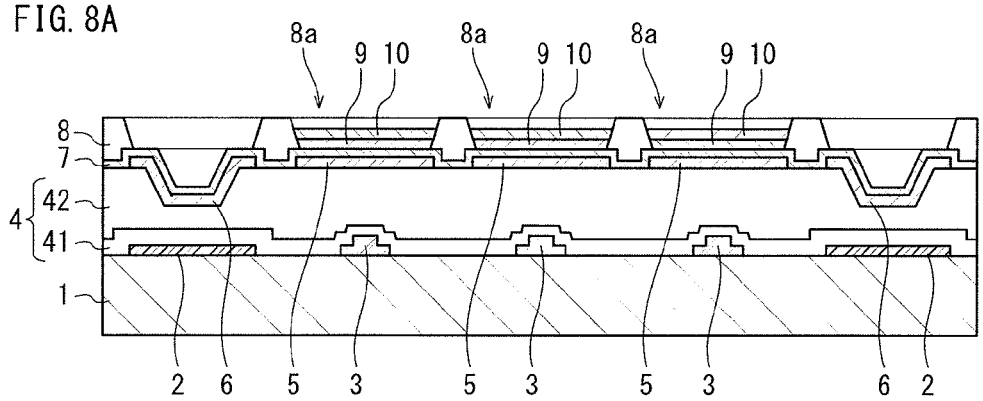
FIGS. 8A-8D are cross-sectional diagrams illustrating the manufacturing process for the organic EL display panel of FIG. 1.
Figure 8B:
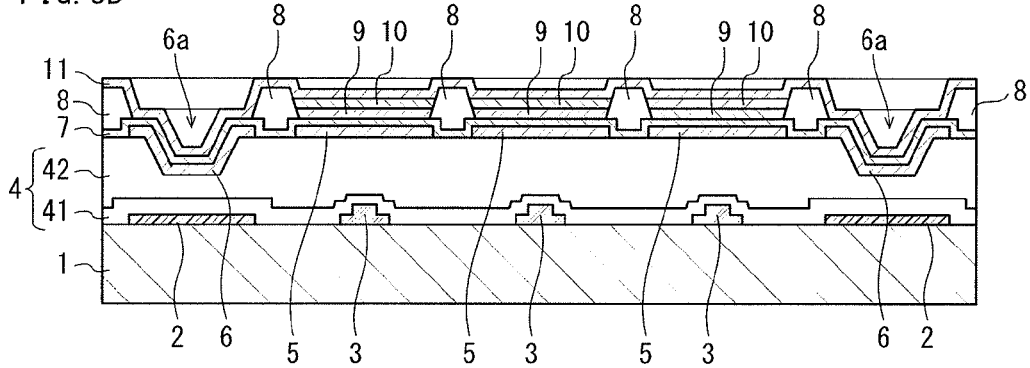
Figure 8C:
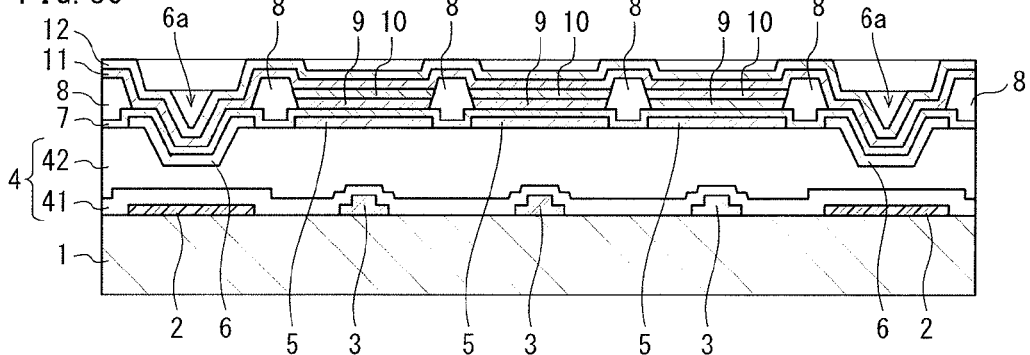

Afterward, the hole transport layer 9 and the organic light-emitting layer 10 are formed in each opening 8a of the partition layer 8 (see FIG. 8A), the electron transport layer 11 is layered so as to entirely cover the partition layer 8 (see FIG. 8B), and the common electrode 12 is layered over the electron transport layer 11 (see FIG. 8C).

Figure 8D:
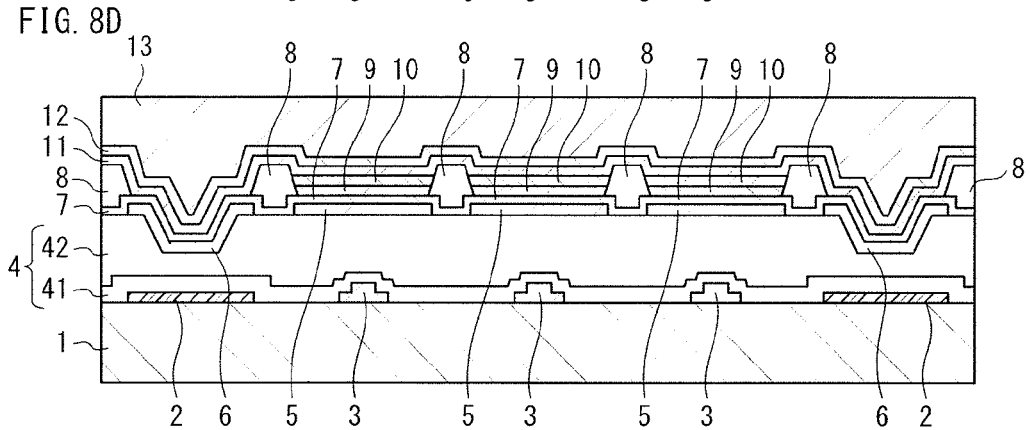

Finally, the sealing layer 13 is layered over the common electrode 12, thereby completing the organic EL display panel (see FIG. 8D).

Embodiment 2

Embodiment 2 differs from Embodiment 1 in the shape used for the concave portions 6a of the auxiliary wiring 6. Otherwise, Embodiment 2 is identical to Embodiment 1, and explanations are therefore omitted.

Figure 9:
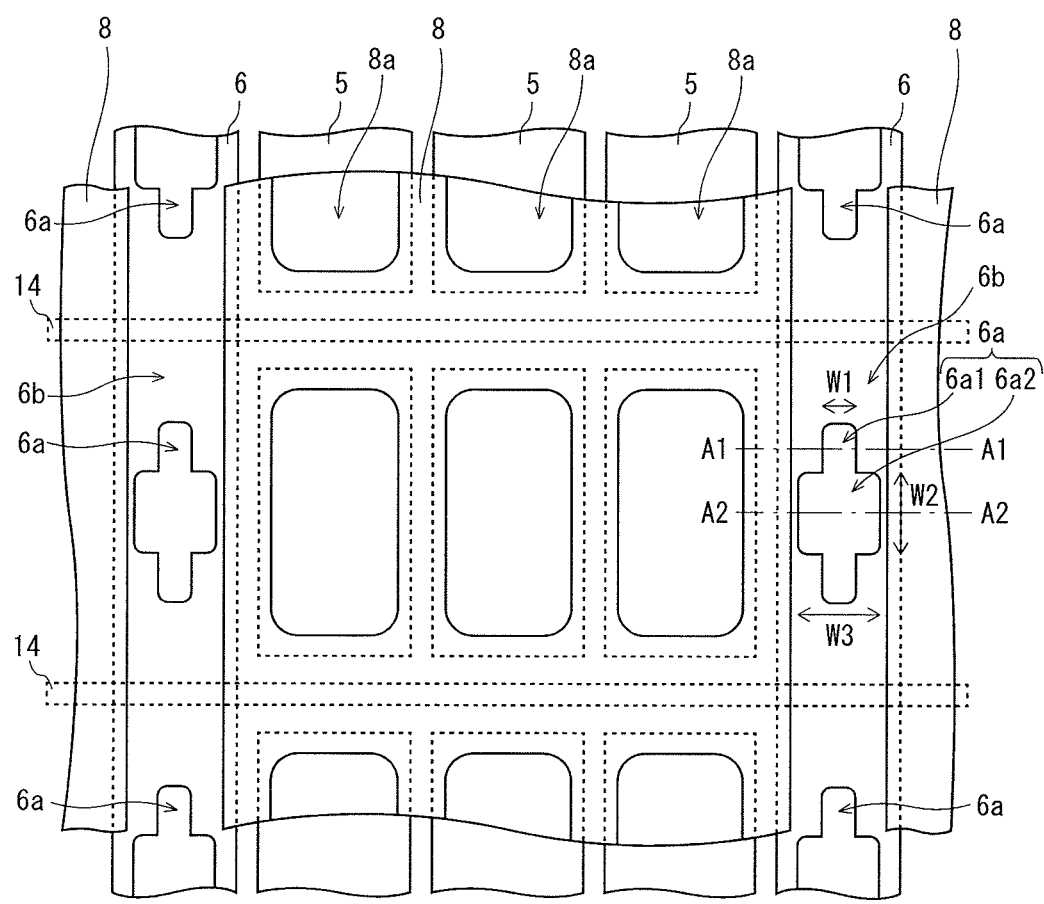
FIG. 9 is plan view diagram showing the layout of an organic EL display panel pertaining to Embodiment 2 of the disclosure, including a pixel electrode, auxiliary wiring, a partition layer, and scan lines.
Figure 10A:
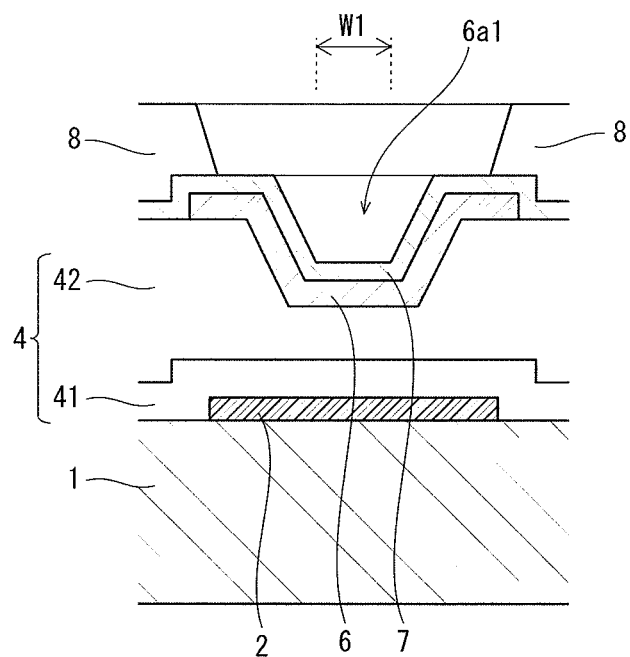
FIG. 10A is a cross-section taken along line A1-A1 of FIG. 9.
Figure 10B:
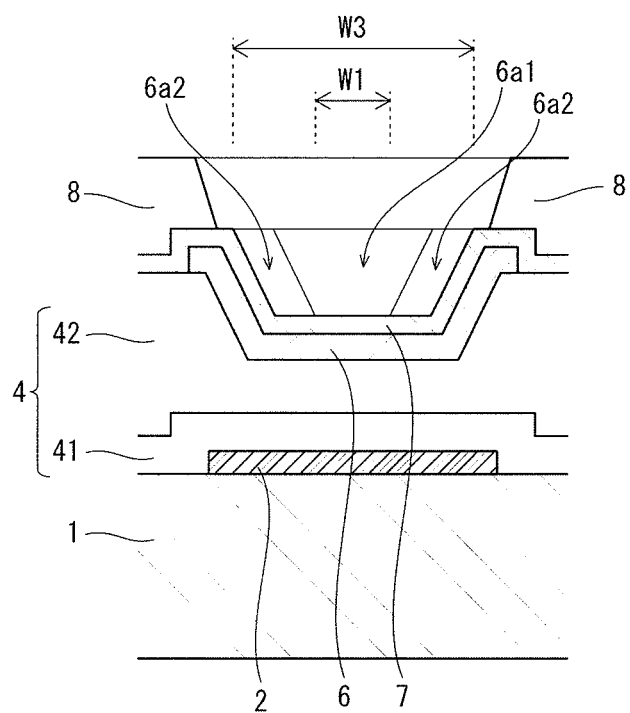
FIG. 10B is a cross-section taken along line A2-A2 of FIG. 9.

FIG. 9 shows a plan view of the organic EL display panel pertaining to Embodiment 2, including pixel electrodes, auxiliary wiring, the partition layer, and scan lines. In the present Embodiment, the concave portions 6a of the auxiliary wiring 6 each include a first groove 6a1 aligned with the auxiliary wiring 6 and second grooves 6a2 each intersecting one of the first grooves 6a1. The second grooves 6a2 each have width W2, which is longer than width W1 of the first grooves 6a1. Similarly, the second grooves 6a2 each have length W3, which is longer than width W1 of the first grooves 6a1. FIG. 10A is a cross-section taken along line A1-A1 of FIG. 9, and FIG. 10B is a cross-section taken along line A2-A2 of FIG. 9. The first grooves 6a1 and the second grooves 6a2 have the same depth.

This Embodiment provides an improvement in the concave portion 6a of the auxiliary wiring 6 enabling the formation of the partition layer 8 with less of the partition material layer 8c remaining in the concave portions 6a. The effects of this Embodiment are described below.

FIGS. 11A-11E schematically illustrate the partition material layer 8c being removed by the developing process. In each of FIGS. 11A-11E, section A1 is a cross-section of the first groove 6a1 (taken along line A1-A1 of FIG. 9) and section A2 is a cross section of the second groove 6a2 (taken along line A2-A2 of FIG. 9).

Figure 11A:
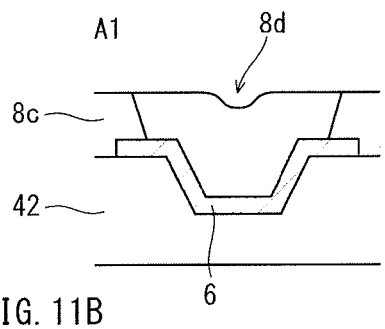
FIGS. 11A-11E schematically illustrate the partition material layer being removed by a developing process.
Figure 11A:
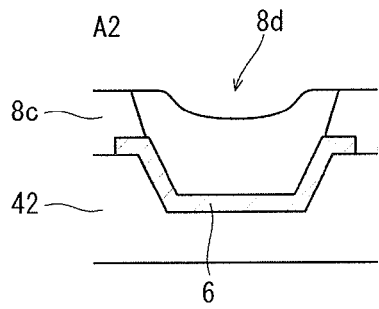

The partition material layer 8c includes a concave part 8d shaped in conformity with the concave portion 6a (see FIG. 11A). However, given that the first groove 6a1 is narrow, the concave part 8d of the partition material layer 8c is likewise narrow. In contrast, given that the second groove 6a2 is wide, the concave part 8d of the partition material layer 8c is likewise wide.

Figure 11B:
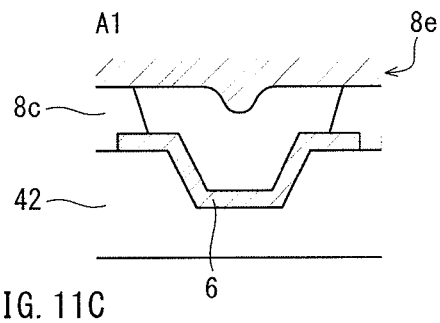
Figure 11B:
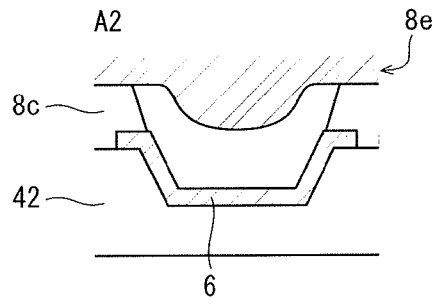
Figure 11C:
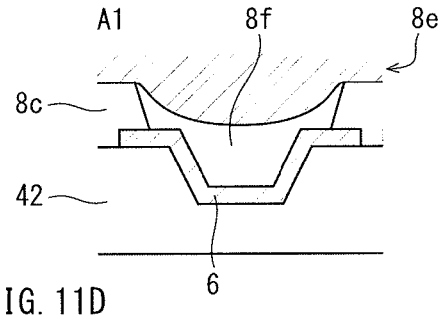
Figure 11C:
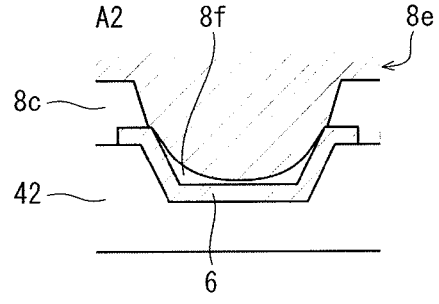
Figure 11D:
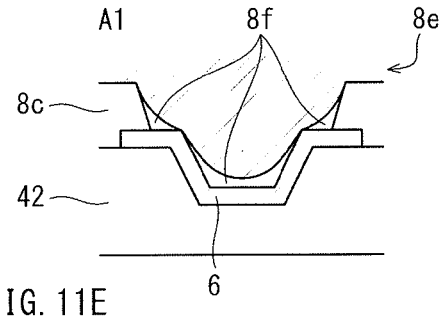
Figure 11D:
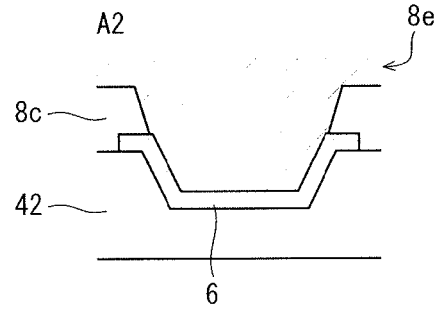
Figure 11E:
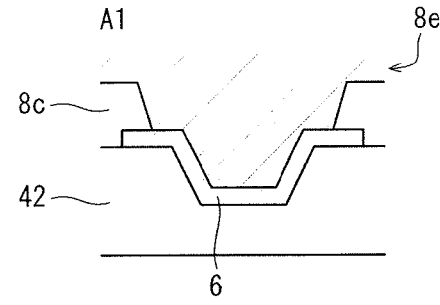
Figure 11E:
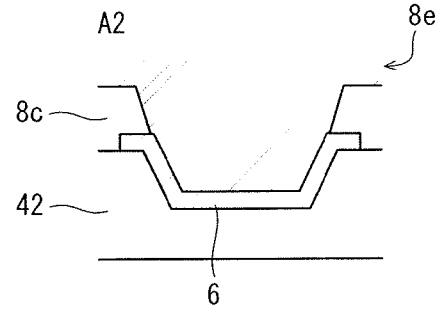

Once the partition material layer 8c is exposed to developing solution 8e, a part 8f of the partition material layer 8c on the auxiliary wiring 6 is gradually dissolved (see FIGS. 11B and 11C). Here, given that the concave part of the partition material layer 8c is relatively wider in the second groove 6a2 than in the first groove 6a1, the developing solution 8e enters more easily and dissolution progresses accordingly (see FIG. 11D). Once the partition material layer 8c in the second groove 6a2 is removed, the developing solution 8e is more easily able to come into contact with the side faces of the first groove 6a1 by passing through the second groove 6a2. Consequently, the partition material layer 8c in the first groove 6a1 is also dissolved from the sides, resulting in removal of the partition material layer 8c from the first groove 6a1 (see FIG. 11E).

When the concave portion 6a of the auxiliary wiring 6 has the first groove along the auxiliary wiring and the second groove that intersects the first groove, and the width of the second groove is greater than the width of the first groove, then upon developing the partition material layer 8c, the developing solution more easily enters the first groove. As a result, less of the partition material layer 8c remains on the concave portion 6a.

When the electron transport layer 11 is formed by vacuum deposition and the common electrode 12 is formed by sputtering, then this also reduces the contact resistance between the auxiliary wiring 6 and the common electrode 12 for the following reasons.

Typically, vacuum deposition is difficult to use for creating a film on side walls of a narrow groove (that is, the method has poor coverage). However, the sputtering method is more amenable to creating a film on side walls of a narrow groove (that is, the method has better coverage). Accordingly, when the electron transport layer 11 is formed over the auxiliary wiring 6, forming the electron transport layer 11 on the side walls of the narrow groove portion is difficult. Thus, some areas are formed in which the electron transport layer 11 is extremely thin or is not present at all. Then, when forming the common electrode 12 over the electron transport layer 11, electrical resistance between the auxiliary wiring 6 and the common electrode 12 is reduced in the corresponding areas.

Then, when the first groove 6a1 is narrow and the second groove 6a2 is wide, in contrast to the first groove 6a1 being wide and the second groove 6a2 being narrow, a longer region is formed in which the first groove 6a1 and the second groove 6a2 do not intersect. That is, the narrow portion of the groove is extended. Accordingly, the contact resistance between the auxiliary wiring 6 and the common electrode 12 is reduced.

As described above, the side walls of the narrow groove have the electron transport layer 11 formed thereon with areas that are extremely thin or completely non-existent. There is a risk of electric fields becoming concentrated in these areas. In such circumstances, the first groove 6a1 may be widened and the second groove 6a2 may be narrowed. Then, in contrast to the first groove 6a1 being narrow and the second groove 6a2 being wide, a shorter region is formed in which the first groove 6a1 and the second groove 6a2 do not intersect. That is, the narrow portion of the groove is shortened. Accordingly, fewer areas are formed in which electrical fields are prone to concentrating.

According to the above, when reducing contact resistance is prioritised, the first groove 6a1 is made narrower and the second groove 6a2 is made wider. Conversely, when electrical field concentration is a more important concern, the first groove 6a1 is made wider and the second groove 6a2 is made narrower.

[Variations]

The present disclosure has been described above with reference to the Embodiments. However, no limitation to the above-described Embodiments is intended. For instance, the following variations may be applied.

(1) Depth of Inter-Layer Insulation Film Concave Portion

Figure 12:
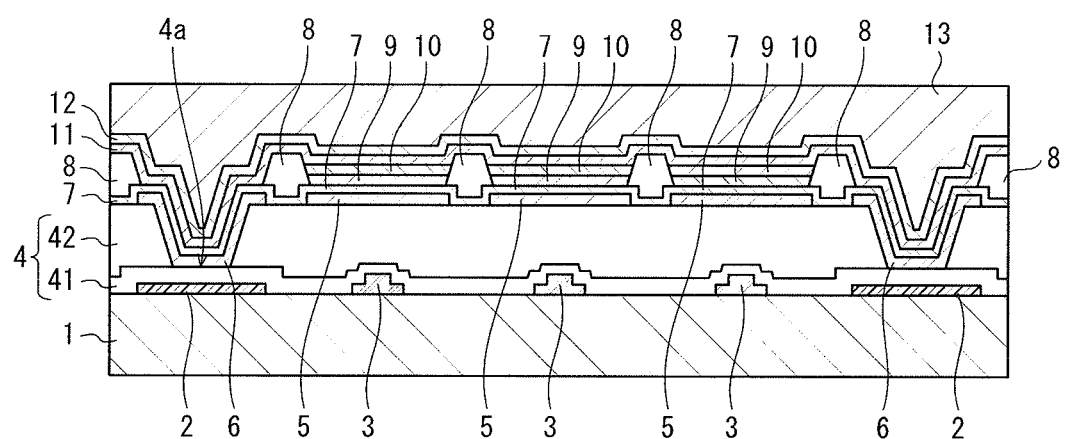
FIG. 12 is a cross-sectional diagram showing an example of a concave portion depth variation.

In Embodiments 1 and 2, the depth of the concave portions 4a of the inter-layer insulation film 4 is established so as to avoid passing completely through the planarization film 42. However, no such limitation is intended, provided that the insulating properties of the inter-layer insulation film 4 are maintained. For example, as shown in FIG. 12, the concave portion 4a of the inter-layer insulation film 4 may pass completely through the planarization film 42 and expose the top of the passivation film 41.

Figure 13:
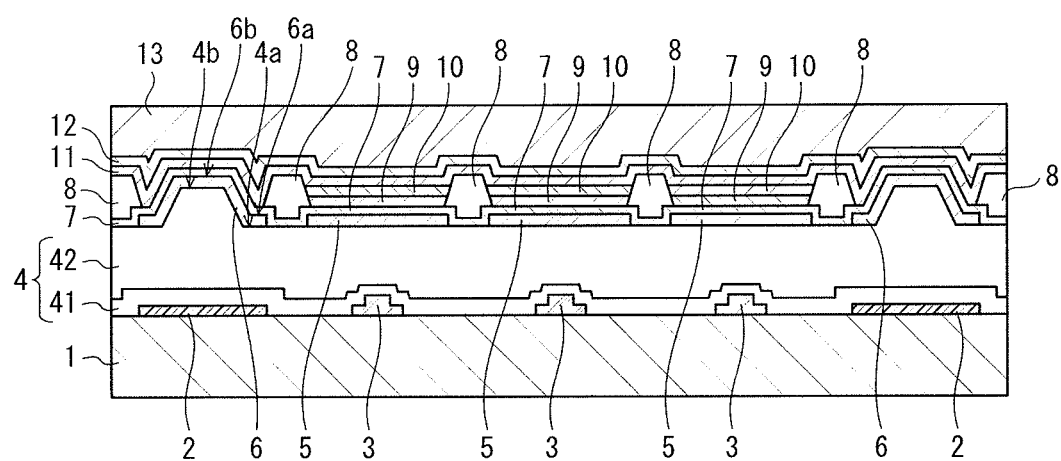
FIG. 13 is a cross-sectional diagram showing an example of a pixel electrode and auxiliary wiring positional relationship variation in terms of depth.
Figure 14A:
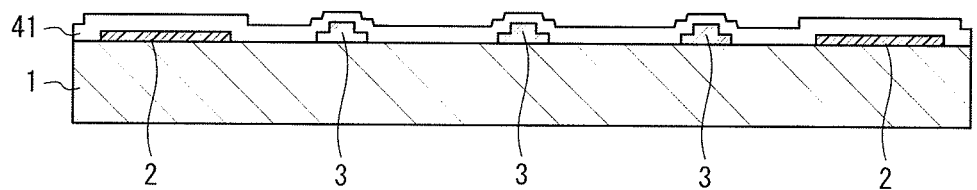
FIGS. 14A-14D are cross-sectional diagrams illustrating the manufacturing process for the organic EL display panel of FIG. 13.
Figure 14B:
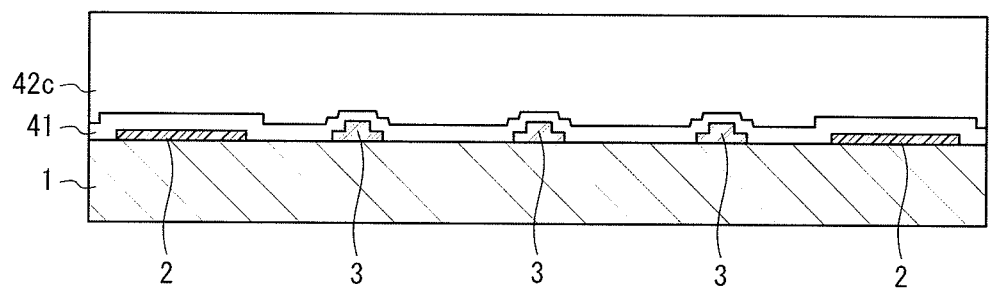
Figure 14C:
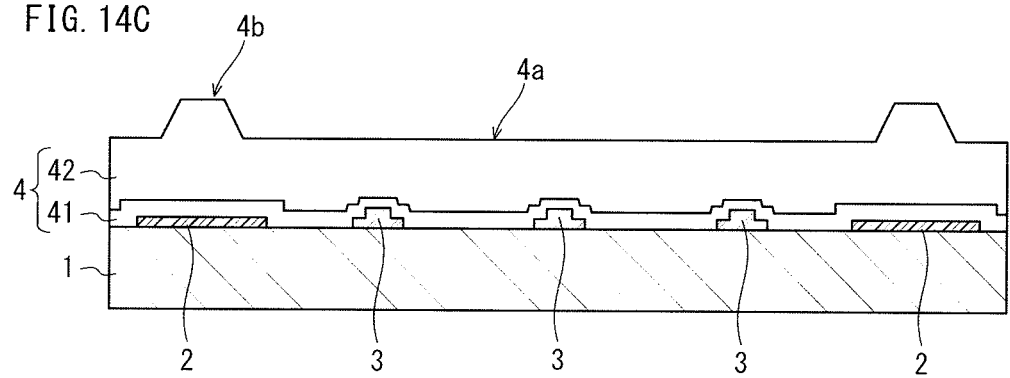
Figure 14D:
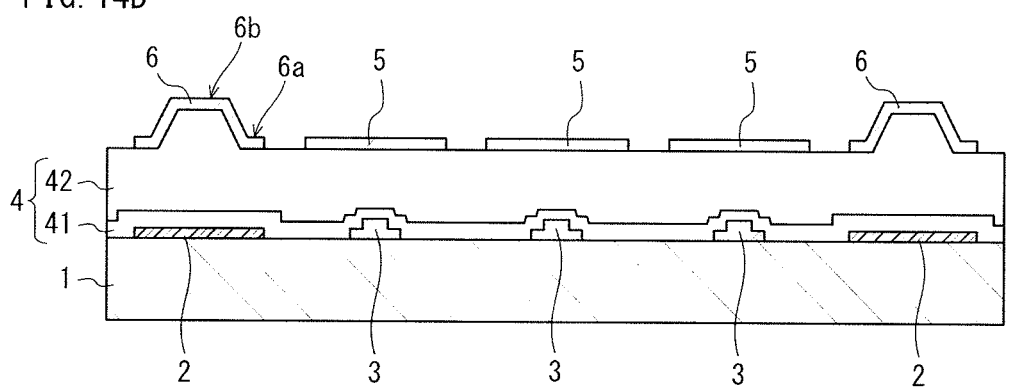

(2) Positional Relationship of Pixel Electrodes and Auxiliary Wiring in Thickness Direction In Embodiments 1 and 2, the pixel electrodes 5 and the non-concave portion 6b of the auxiliary wiring are found at the same level with respect to the thickness direction (e.g., see FIG. 1). In contrast, as shown in FIG. 13, the pixel electrodes 5 and the concave portion 6a of the auxiliary wiring 6 may be at the same level in terms of the thickness direction. According to the configuration of FIG. 13, the concave portion 4a and the non-concave portion 4b of the inter-layer insulation film 4 are provided in a region over which the auxiliary wiring 6 is disposed. Thus, the concave portion 6a and the non-concave portion 6b of the auxiliary wiring 6 are provided and the contact surface area is increased as a result of the expanded side wall area at the boundary between the concave portion 6a and the non-concave portion 6b.

FIGS. 14A-14D are cross-sectional diagrams illustrating a manufacturing process for the organic EL display panel. The power supply wiring 2, the TFTs 3, and the passivation film 41 are formed over the substrate 1 (see FIG. 14A), and the planarization material layer 42c is layered over the passivation film 41 (see FIG. 14B). Then, the planarization material layer 42c is exposed through a photo-mask, and developing is performed afterward (see FIG. 14C). Then, the concave portions 4a are formed in the region of formation for the pixel electrodes 5 and the concave portion 6a of the auxiliary wiring 6 and the non-concave portions 4b are formed in the regions of formation for the non-concave portions 6b of the auxiliary wiring 6. This point differs from Embodiments 1 and 2. The pixel electrodes 5 and the auxiliary wiring 6 are subsequently formed over the inter-layer insulation film 4 (see FIG. 14D).

(3) Shape and Quantity of Concave Portions

In Embodiments 1 and 2, specific shapes and quantities are given for the concave portions. However, no such limitation is intended provided that the concave portions and non-concave portions are provided. Each of the following examples produce the effect of increasing the contact surface area by the area of the side walls at the boundary between the concave portions 6a and the non-concave portions 6b.

FIGS. 15A-15C, 16A-16C, 17A-17C, 18A-18C, and 19A-19C illustrate variations pertaining to the concave portions. FIGS. 15A, 16A, 17A, 18A, and 19A are plan views, FIGS. 15B, 16B, 17B, and 19B are cross-sections taken along line A-A, FIG. 18B shows cross-sections taken along lines A1-A1 and A2-A2, and FIGS. 15C, 16C, 17C, 18C, and 19C are cross-sections taken along line B-B.

Figure 15A:
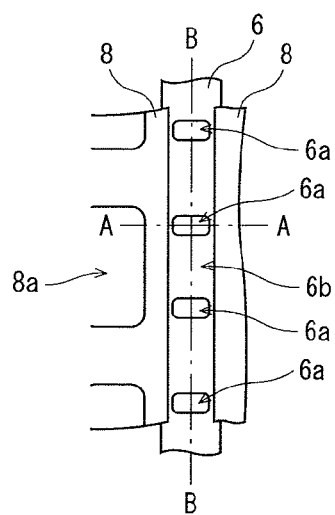
FIG. 15A is a plan view of a concave portion variation example.
Figure 15B:
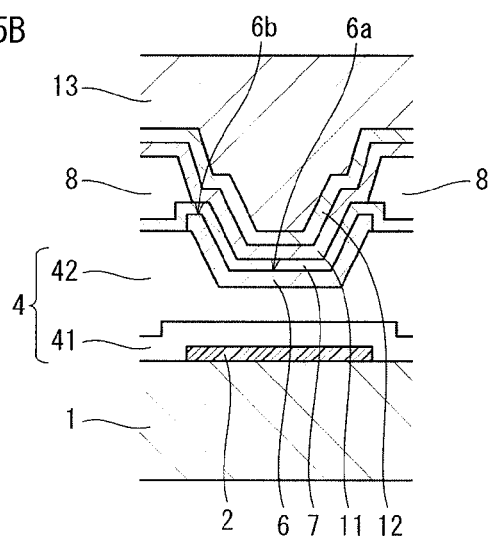
FIG. 15B is a cross-sectional diagram taken along line A-A.
Figure 15C:
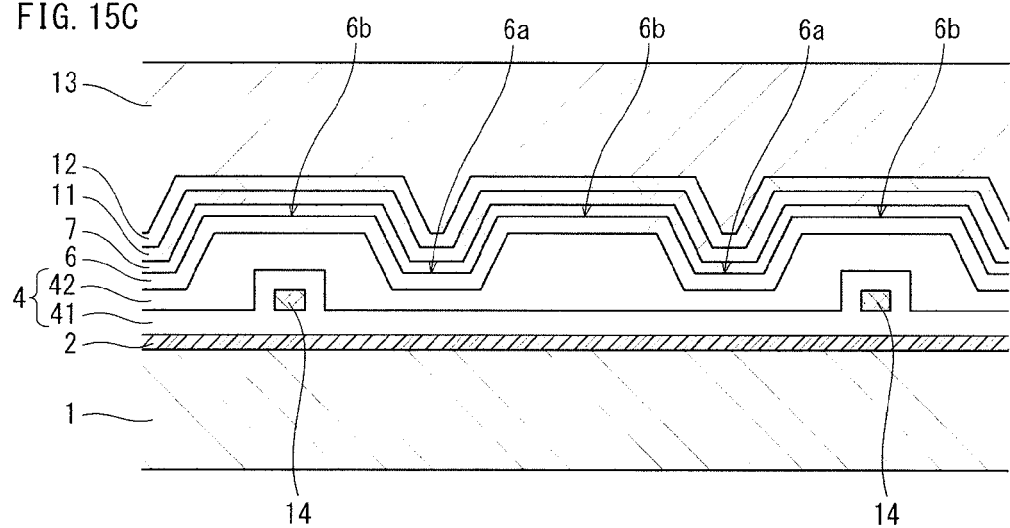
FIG. 15C is a cross-sectional diagram taken along line B-B.

In FIGS. 15A-15C, the concave portions 6a are substantially rectangular as seen in the plan view, and two concave portions 6a are provided for each row. Alternatively, the concave portions 6a may be round or oval, as seen in the plan view. Also, more than two of the concave portions 6a may be provided per row, such as a few tens per row.

Figure 16A:
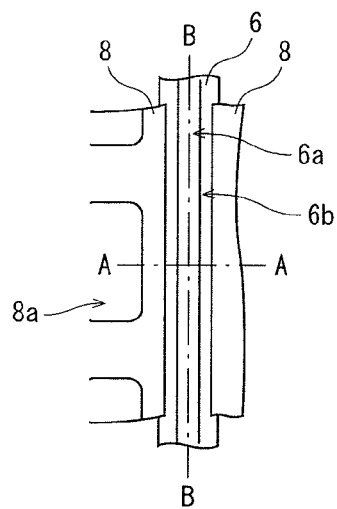
FIG. 16A is a plan view of a concave portion variation example.
Figure 16B:
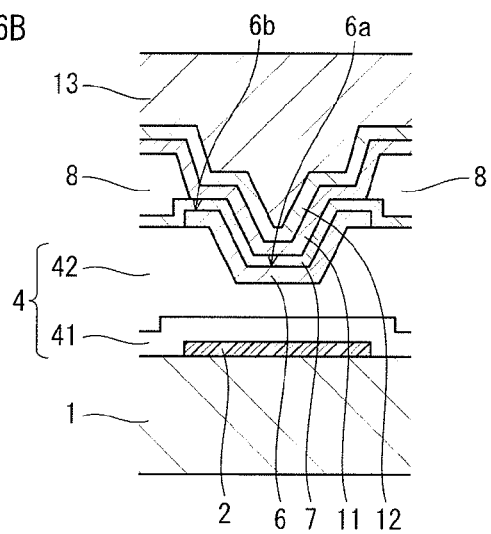
FIG. 16B is a cross-sectional diagram taken along line A-A.
Figure 16C:
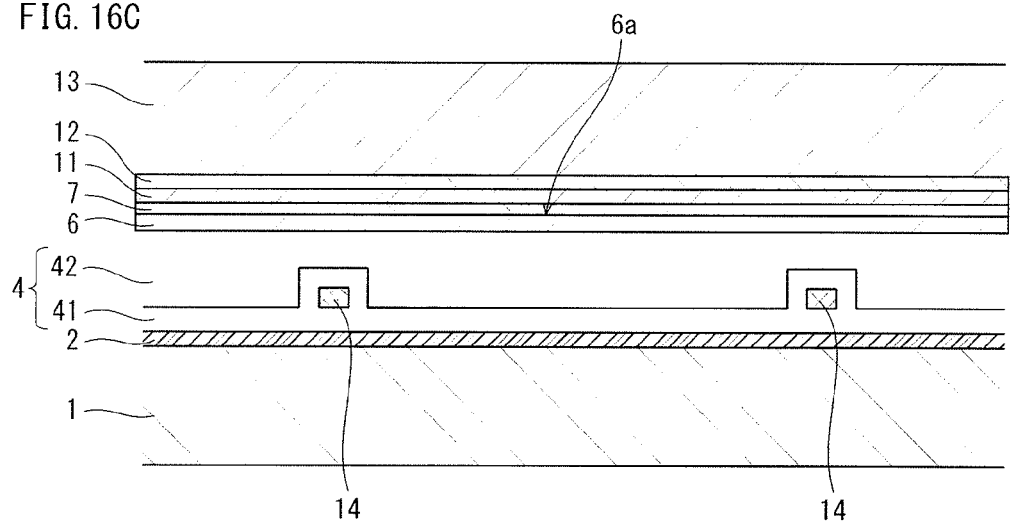
FIG. 16C is a cross-sectional diagram taken along line B-B.

In FIGS. 16A-16C, the concave portion 6a is provided as a groove formed along the entirety of the auxiliary wiring 6. In this example, and in contrast to Embodiment 1, the distance between the scan line and the auxiliary wiring is reduced and the surface area of the side walls is increased at the boundary between the concave portion 6a and the non-concave portion 6b. The determination of whether to apply Embodiment 1 or the variation of FIGS. 16A-16C is beneficially based on the relative importance of reducing signal delay in scan line input and increasing the contact surface area between the auxiliary wiring and the common electrode.

Figure 17A:
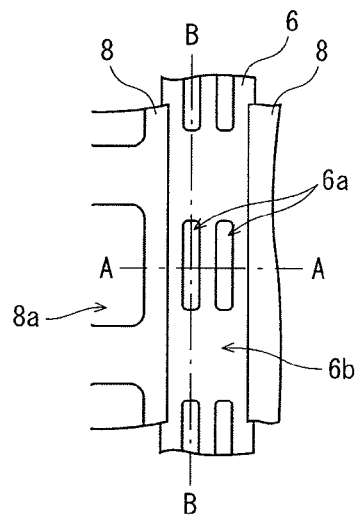
FIG. 17A is a plan view of a concave portion variation example.
Figure 17B:
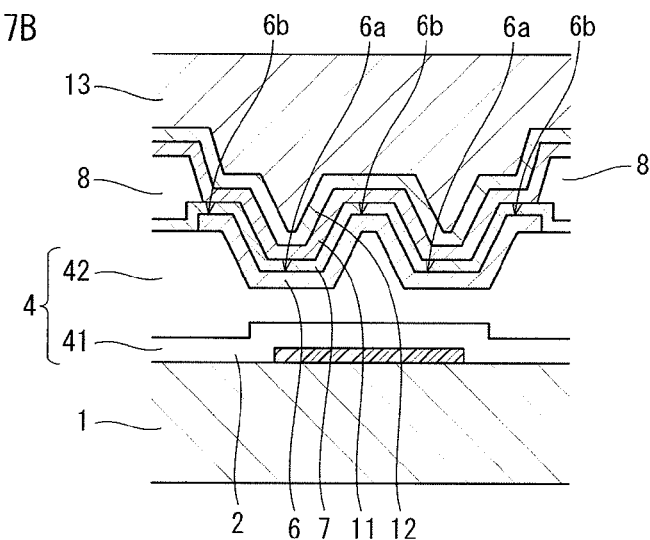
FIG. 17B is a cross-sectional diagram taken along line A-A.
Figure 17C:
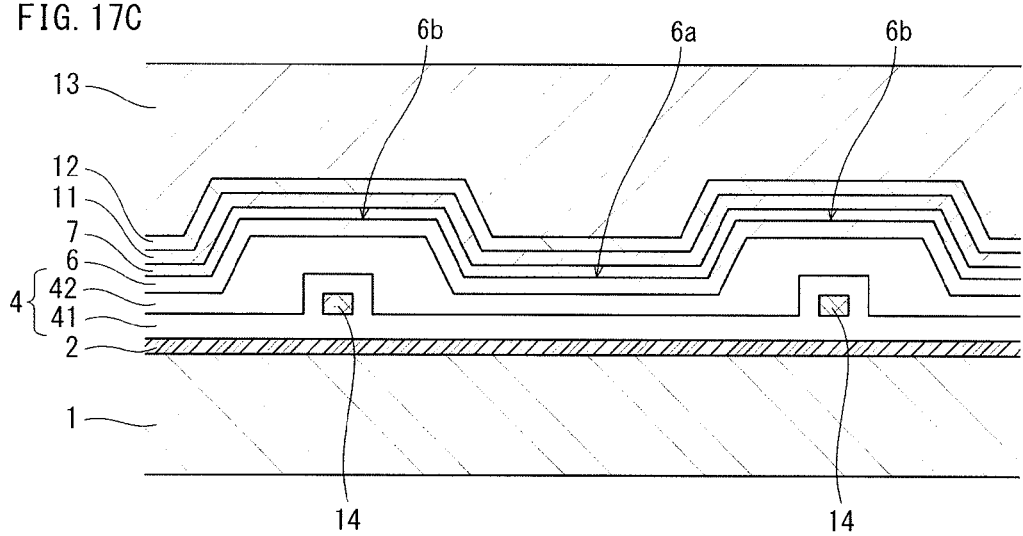
FIG. 17C is a cross-sectional diagram taken along line B-B.

In FIGS. 17A-17C, the concave portions 6a are grooves along the auxiliary wiring 6, and two concave portions 6a are provided per column. Accordingly, the surface area of the side walls at the boundary between the concave portion 6a and the non-concave portion 6b is easily increased.

Figure 18A:
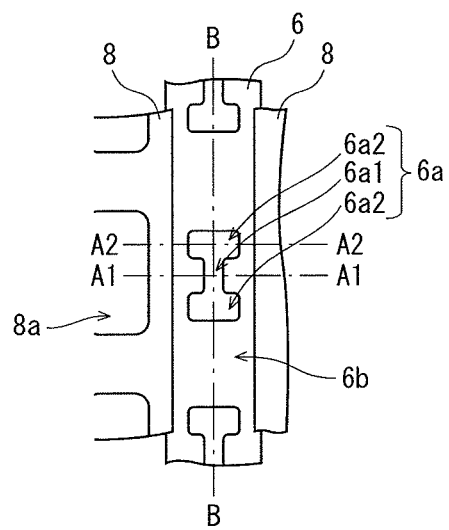
FIG. 18A is a plan view of a concave portion variation example.
Figure 18B:
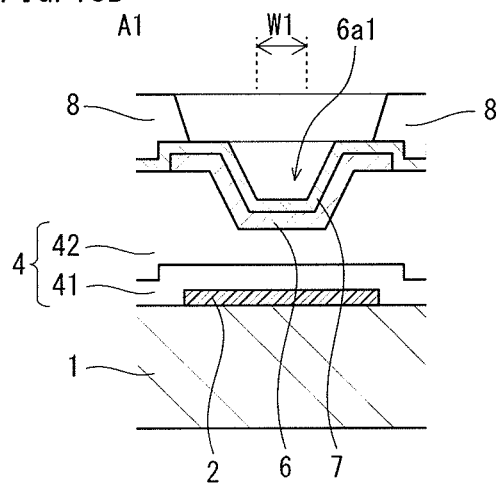
FIG. 18B shows cross-sectional diagrams taken along lines A1-A1 and A2-A2.
Figure 18B:
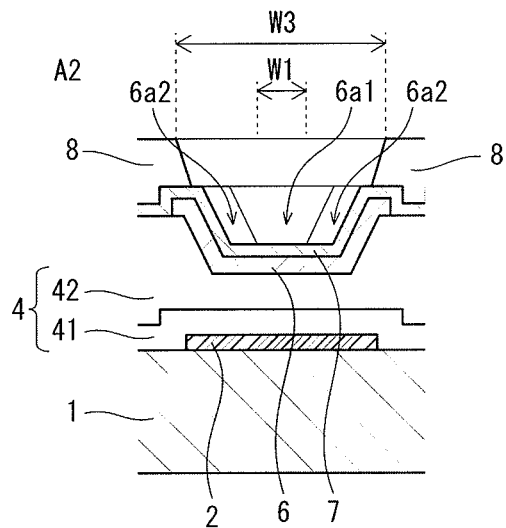
Figure 18C:
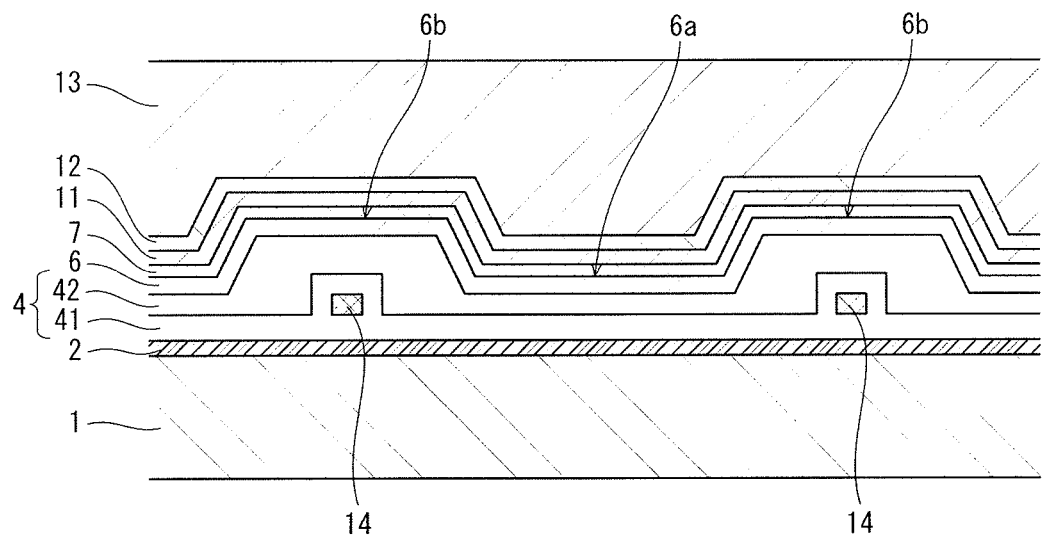
FIG. 18C is a cross-sectional diagram taken along line B-B.

In FIGS. 18A-18C, the concave portions 6a of the auxiliary wiring 6 each have a first groove 6a1 and two second grooves 6a2 that intersect the first groove 6a1. This shape also reduces the amount of partition material layer 8c remaining on the concave portion 6a during the formation of the partition layer 8.

Figure 19A:
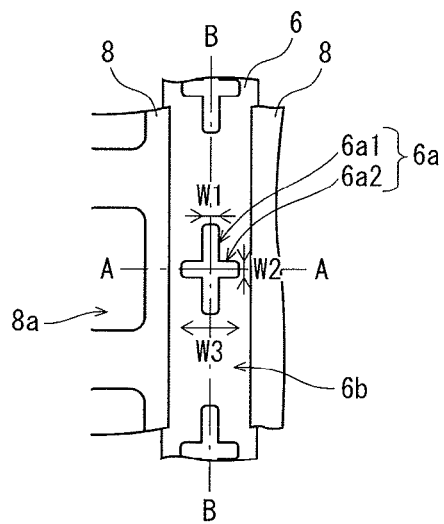
FIG. 19A is a plan view of a concave portion variation example.
Figure 19B:
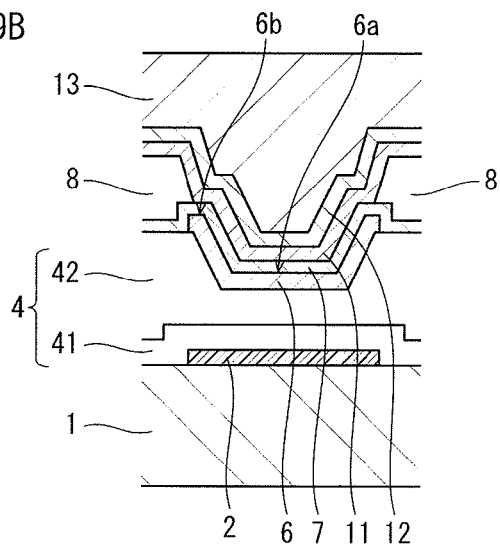
FIG. 19B is a cross-sectional diagram taken along line A-A.
Figure 19C:
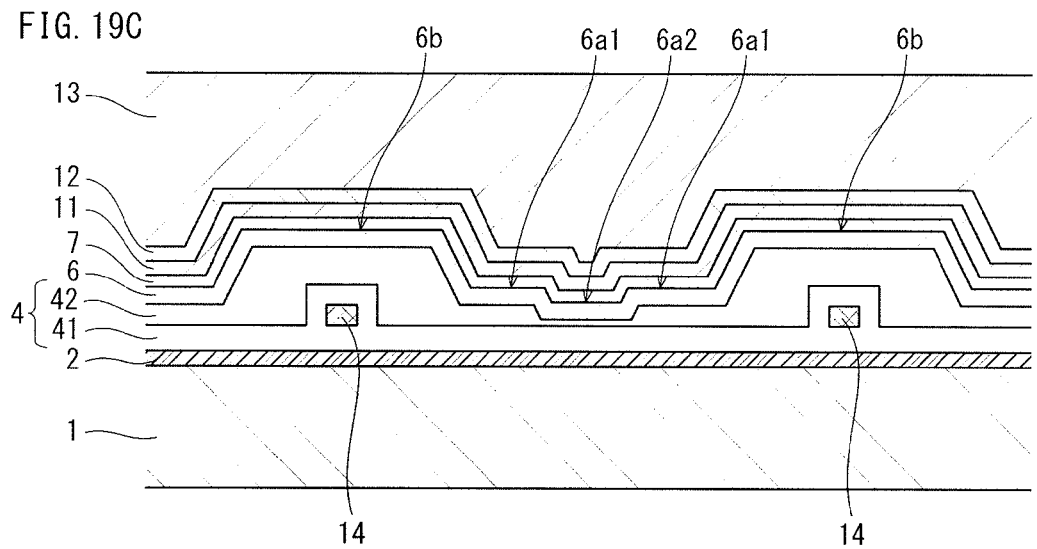
FIG. 19C is a cross-sectional diagram taken along line B-B.

In FIGS. 19A-19C, the concave portions 6a of the auxiliary wiring 6 each have a first groove 6a1 and a second groove 6a2 that intersects the first groove 6a1. The point of difference from Embodiment 2 is that the first groove 6a1 has width W1 that is equal to width W2 of the second groove 6a2, and that the second groove 6a1 is deeper than the first groove 6a2. Accordingly, the second groove 6a2 being deeper than the first groove 6a1 also reduces the amount of partition material layer 8c remaining on the concave portion 6a during the formation of the partition layer 8. Making the width W2 of the second groove 6a2 wider than the width W1 of the first groove 6a1 further increases the effect.

Obviously, the widths and depths of the first groove 6a1 and the second groove 6a2 may be adjusted and combined. For example, the first groove 6a1 may be made deeper and wider than the second groove 6a2.

Also, the following effects are provided by using the first groove 6a1 and the second groove 6a2. During organic EL display panel manufacturing, dust may adhere to the auxiliary wiring 6. When dust has adhered to the auxiliary wiring 6, the additional height of the dust may produce pinholes on the sealing layer 13. Such pinholes allow infiltration by water and air, which leads to partial degradation of the electron transport layer 11. Also, water and air are constantly supplied through the pinholes, which means that the degradation of the electron transport layer 11 gradually radiates from the pinholes.

Also, when vacuum deposition is used to form the electron transport layer 11 as described above, then some areas are formed on the side walls of the groove in the auxiliary wiring 6 in which the electron transport layer 11 is extremely thin or is not present at all. Although degradation of the electron transport layer 11 may gradually radiate from the pinholes, said areas where the electron transport layer 11 is extremely thin or not present at all may delay or even halt the spread of degradation. Accordingly, the decrease in useful life caused by degradation of the electron transport layer 11 is constrainable.

(4) Layer Configuration within Concave Portion of Auxiliary Wiring

Figure 20:
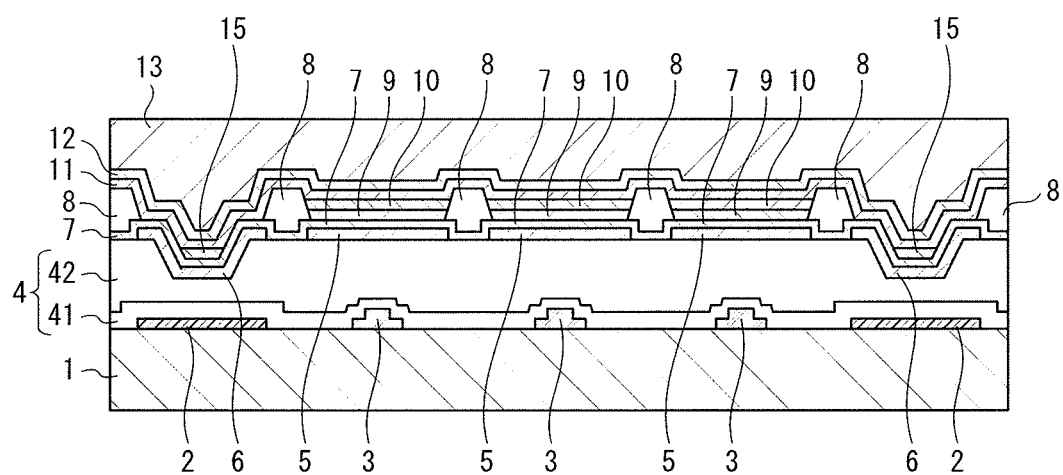
FIG. 20 is a cross-sectional diagram of a layer configuration variation pertaining to the concave portions of the auxiliary wiring.

In Embodiments 1 and 2, the organic light-emitting layer 10 is formed only within the openings 8a on the pixel electrodes 5. However, no such limitation is intended. For example, as shown in FIG. 20, a material layer 15 may be formed from the same material as the organic light-emitting layer 10 within the openings 8b on the auxiliary wiring 6. Specifically, as shown, the material layer 15 is formed from the same material as the organic light-emitting layer 10 in the concave portions 6a of the auxiliary wiring 6.

Figure 21A:
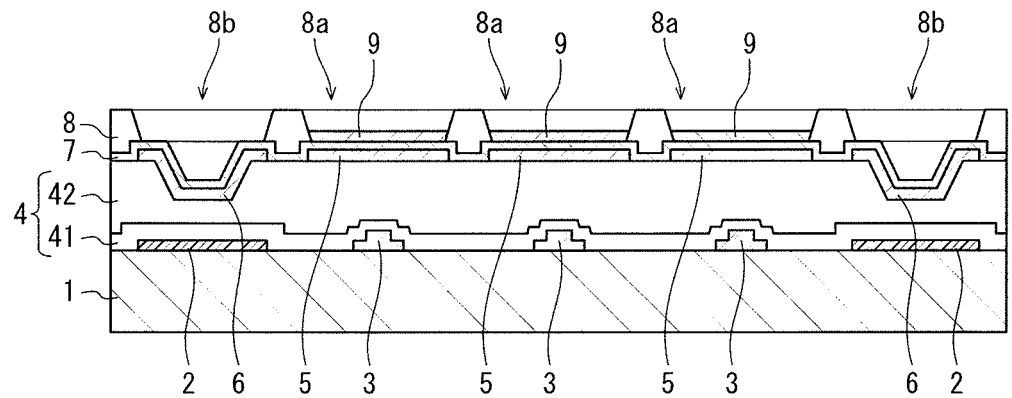
FIGS. 21A-21C are cross-sectional diagrams illustrating the manufacturing process for the organic EL display panel of FIG. 20.
Figure 21B:
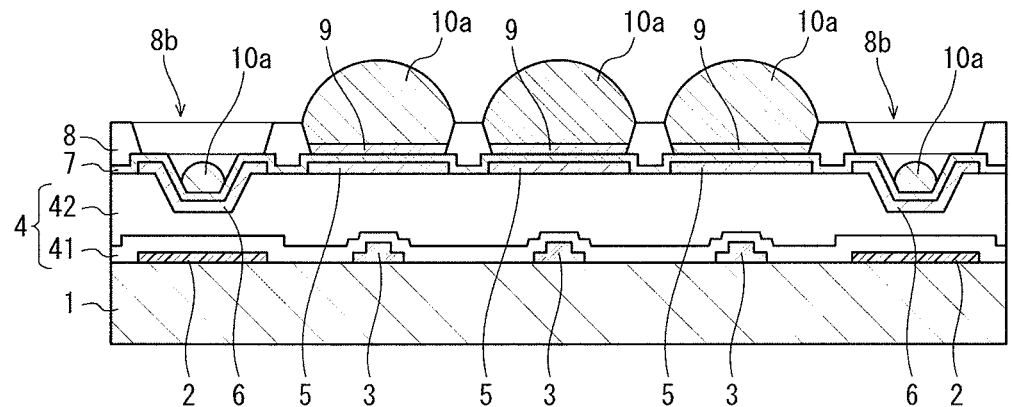
Figure 21C:
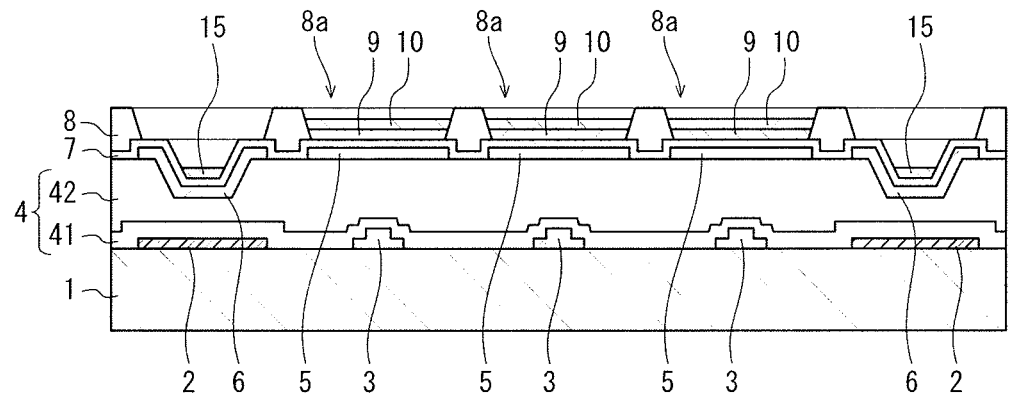

FIGS. 21A-21C are cross-sectional diagrams illustrating a manufacturing process for the organic EL display panel. The partition layer 8 is formed with the openings 8a over the pixel electrodes 5 and the openings 8b over the auxiliary wiring 6 (see FIG. 21A). Next, an ink 10a is dripped into the openings 8a, the ink 10a including the organic light-emitting material of the organic light-emitting layer 10 and a solvent. The ink 10a is also dripped into the openings 8b at this time (see FIG. 21B). Then, as the solvent evaporates from the ink 10a, the organic light-emitting layer 10 is formed in each of the openings 8a and the material layer 15 is formed from same material as the organic light-emitting layer 10 in each of the openings 8b (see FIG. 21C). As such, dripping the ink 10a into the openings 8b ensures that each of the openings 8a is surrounded by ink 10a on each side. Thus, the solvent evaporates evenly for all of the openings 8a. As a result, organic light-emitting layer 10 formation variability is constrained.

(5) Angle Between First Groove and Second Groove

In Embodiment 2, the first groove 6a1 and the second groove 6a2 intersect at right angles. However, no particular limitation is intended regarding this intersection. For example, the angle between the first groove 6a1 and the second groove 6a2 need not be 90°, and may instead be 45° or 60°.

(6) Plan View of Auxiliary Wiring

In Embodiments 1 and 2, the auxiliary wiring 6 is arranged in stripes along the column direction. However, no such limitation is intended. For example, the auxiliary wiring may be arranged as a mesh with stripes along the column direction and the row direction.

(7) Auxiliary Wiring Quantity

In Embodiments 1 and 2, the auxiliary wiring 6 is provided once every three pixels. However, no such limitation is intended. For example, the wiring may be provided every pixel, or at intervals greater than once every three pixels.

(8) Scan Line Quantity

In Embodiments 1 and 2, the scan lines are provided once every row. However, no such limitation is intended. This quantity may be determined according to the configuration of the drive circuit provided to each pixel.

(9) Pixel Layer Configuration

In Embodiments 1 and 2, the pixel electrodes 5 and the common electrode 12 are separated by the hole injection layer 7, the hole transport layer 9, the organic light-emitting layer 10, and the electron transport layer 11. However, no such limitation is intended provided that the organic light-emitting layer 10 is located therebetween.

(10) Inter-Layer Insulation Film Configuration

In Embodiments 1 and 2, the inter-layer insulation film 4 includes a passivation film 41 and a planarization film 42. However, no such limitation is intended provided that insulation is present between the layer where the pixel circuit is located and the layer where the organic EL element is located.

(11) Display Device Application

Figure 22:
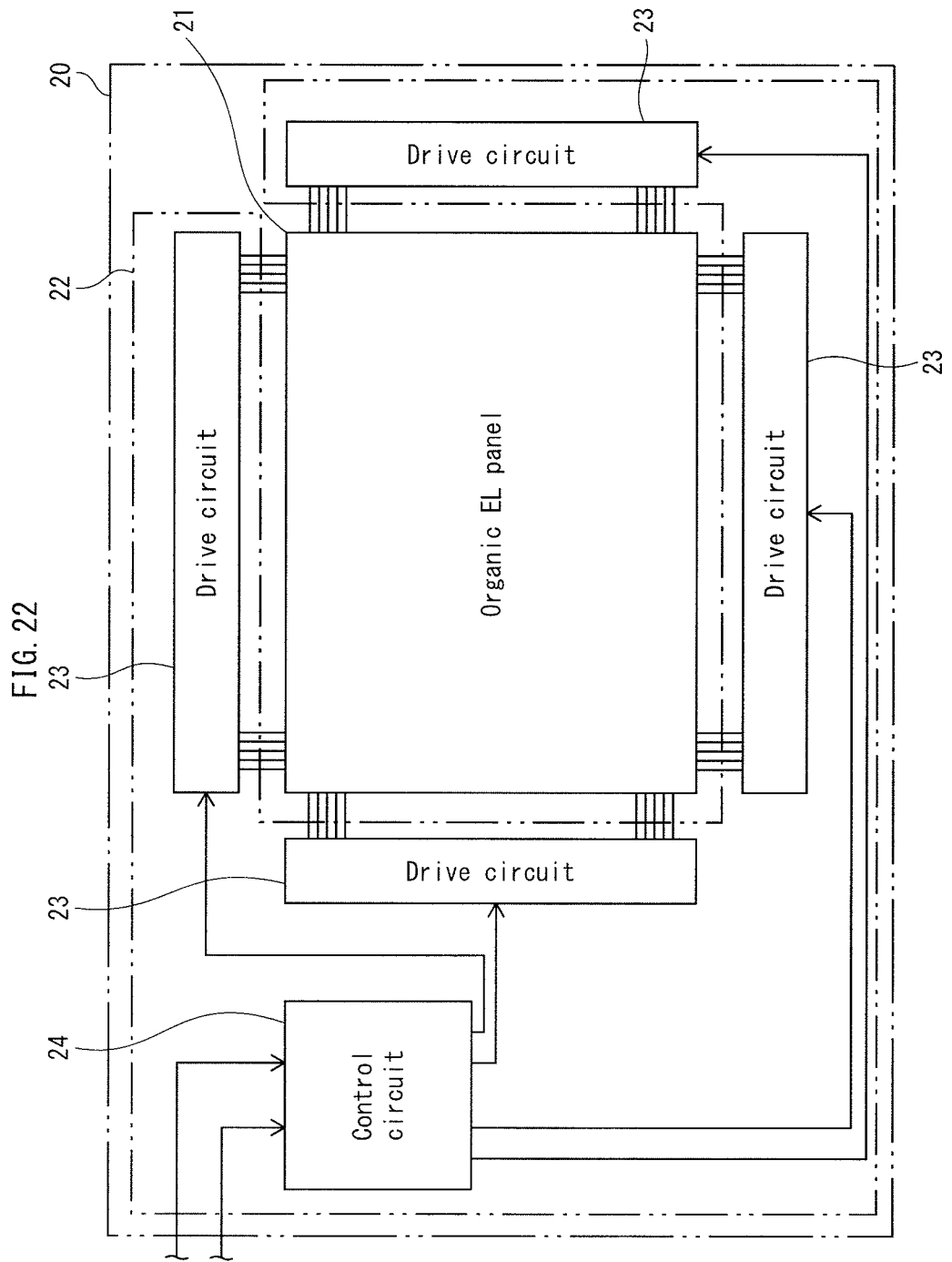
FIG. 22 is a functional block diagram of a display device applying the organic EL display panel of FIG. 1.
Figure 23:
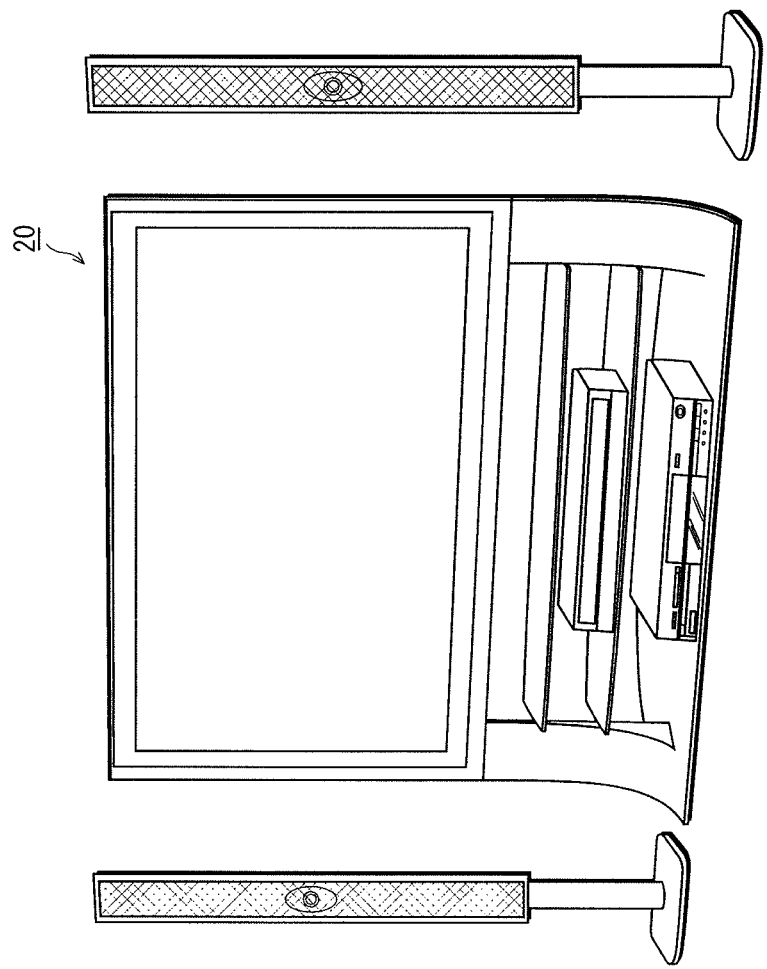
FIG. 23 is a perspective view of the display device of FIG. 22.
Figure 24:
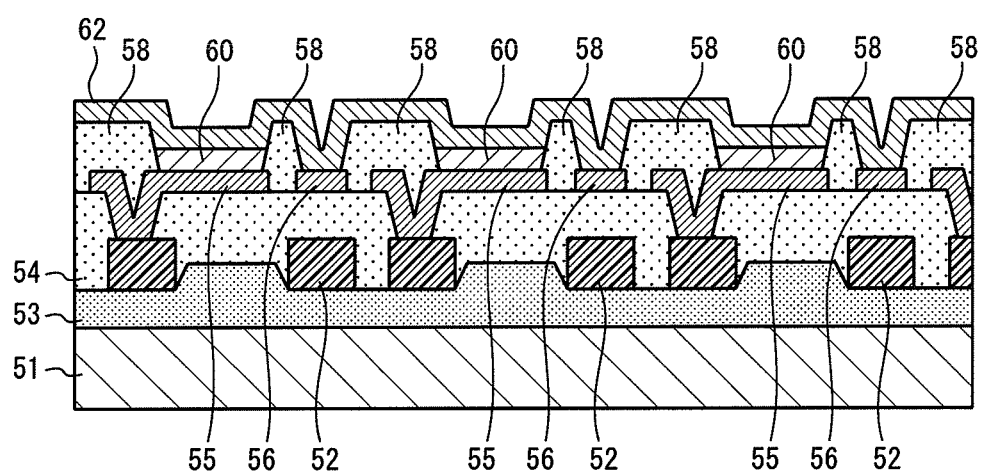
FIG. 24 is a partial cross-sectional diagram showing the configuration of a organic EL display panel described in Patent Literature 1.

FIG. 22 is a functional block diagram of a display device applying the organic EL display panel of FIG. 1. FIG. 23 is a perspective view of the display device of FIG. 22. The display device 20 includes a organic EL display panel 21 and drive control units 22 electrically connected thereto. The drive control units 22 each include a drive circuit 23 and a control circuit 24 that control the drive circuit 23.

INDUSTRIAL APPLICABILITY

The present invention is applicable to organic EL displays and the like.

REFERENCE SIGNS LIST

1 Substrate
2 Power supply wiring
3 Thin film transistor
4 Inter-layer insulation film
4a Concave portion
4b Non-concave portion
4c Inter-layer insulation material layer
5 Pixel electrode
5c Conductive layer
6 Auxiliary wiring
6a Concave portion
6a1 First groove
6a2 Second groove
6b Non-concave portion
7 Hole injection layer
8 Partition layer
8a Opening over pixel electrode
8b Opening over auxiliary wiring
8c Partition material layer
8d Concave part of partition material layer
8e Developing fluid
8f Part of partition material layer over auxiliary wiring
9 Hole transport layer
10 Organic light-emitting layer
10a Ink
11 Electron transport layer
12 Common electrode
13 Sealing layer
14 Scan line
15 Material layer of same material as organic light-emitting layer
20 Display device
21 Organic EL display panel
22 Drive control circuit
23 Drive circuit
24 Control circuit
41 Passivation film
42 Planarization film
51 Substrate
52 Power supply wiring
53 TFT layer
54 Inter-layer insulation film
55 Pixel electrode
56 Auxiliary wiring
58 Partition layer
60 Organic light-emitting layer
62 Common electrode

The invention claimed is:

1. An organic electroluminescence display panel, comprising:
 a substrate;
 a thin film transistor disposed over the substrate;
 an inter-layer insulation film disposed over the thin film transistor;
 a pixel electrode disposed over the inter-layer insulation film;
 auxiliary wiring disposed over the inter-layer insulation film with separation from the pixel electrode;
 a partition layer disposed over the inter-layer insulation film and having openings respectively arranged over the pixel electrode and over the auxiliary wiring;
 an organic light-emitting layer disposed in the openings over the pixel electrode; and
 a common electrode facing the pixel electrode through the openings over the pixel electrode and electrically connected to the pixel electrode via the organic light-emitting layer, and also facing the auxiliary wiring through the openings over the auxiliary wiring and electrically connected to the auxiliary wiring, wherein the inter-layer insulation film has at least one paired concave portion and non-concave portion disposed in an area over which the auxiliary wiring is disposed, a top face of the concave portion being concave with respect to a top face of the non-concave portion, and the auxiliary wiring includes a part over the concave portion and a part over the non-concave portion, a top face of the part over the concave portion being concave with respect to a top face of the part over the non-concave portion.

2. The organic electroluminescence display panel of claim 1, wherein the inter-layer insulation film includes an insulating material that is exposed throughout the top face of the concave portion.

3. The organic electroluminescence display panel of claim 2, wherein the inter-layer insulation film includes:
a passivation layer disposed over the thin film transistor; and
a planarization layer disposed over the passivation film, and the top face of the concave portion is located at one of a position within the planarization layer and a boundary between the passivation layer and the planarization layer.

4. The organic electroluminescence display panel of claim 1, further comprising a scan line disposed over the substrate, for transmitting a scan signal controlling operations of the thin film transistor, wherein as seen in a plan view, the area of the inter-layer insulation film over which the auxiliary wiring is disposed includes an overlapping region that overlaps the scan line and a non-overlapping region that does not overlap the scan line, and within the area, the concave portion of the inter-layer insulation film is disposed in the non-overlapping region and is not disposed in the overlapping region.

5. The organic electroluminescence display panel of claim 4, wherein the overlapping region of the inter-layer insulation film has a planar top face.

6. The organic electroluminescence display panel of claim 4, wherein as seen in the plan view, the scan line intersects the auxiliary wiring.

7. The organic electroluminescence display panel of claim 1, further comprising power supply wiring disposed over the substrate, for applying a power supply voltage to the thin film transistor, wherein as seen in a plan view, the concave portion of the inter-layer insulation film overlaps the power supply wiring, and the inter-layer insulation film includes an insulating material arranged between the power supply wiring and the auxiliary wiring part over the concave portion.

8. The organic electroluminescence display panel of claim 1, further comprising a layer of material identical to the organic light-emitting layer disposed between the common electrode and the auxiliary wiring part over the concave portion.

9. The organic electroluminescence display panel of claim 1, wherein the concave portion of the inter-layer insulation film includes a first groove extending along the auxiliary wiring and a second groove that intersects at least part of the first groove, and the second groove is wider than the first groove.

10. The organic electroluminescence display panel of claim 1, wherein the concave portion of the inter-layer insulation film includes a first groove extending along the auxiliary wiring and a second groove that intersects at least part of the first groove, and the second groove is deeper than the first groove.

11. The organic electroluminescence display panel of claim 1, further comprising a functional layer that is in contact with the organic light-emitting layer through the openings over the pixel electrode, and with the auxiliary wiring through the openings over the auxiliary wiring, wherein the common electrode is in contact with the functional layer through the openings over the auxiliary wiring.

12. A manufacturing method for an organic electroluminescence display panel, comprising:

preparing a substrate;
forming a thin film transistor over the substrate;
forming an inter-layer insulation film over the thin film transistor;
a pixel electrode disposed over the inter-layer insulation film;
forming auxiliary wiring over the inter-layer insulation film with separation from the pixel electrode;
forming a partition layer over the inter-layer insulation film with openings respectively formed over the pixel electrode and over the auxiliary wiring;
forming an organic light-emitting layer in the openings over the pixel electrode; and
forming a common electrode facing the pixel electrode through the openings over the pixel electrode and electrically connected to the pixel electrode via the organic light-emitting layer, and also facing the auxiliary wiring through the openings over the auxiliary wiring and electrically connected to the auxiliary wiring, wherein the inter-layer insulation film is formed to have at least one paired concave portion and non-concave portion formed in an area over which the auxiliary wiring is disposed, a top face of the concave portion being concave with respect to a top face of the non-concave portion, and the auxiliary wiring is formed to include a part over the concave portion and a part over the non-concave portion, a top face of the part over the concave portion being concave with respect to a top face of the part over the non-concave portion.

* * * * *